| (12) | United States Patent | (10) Patent No.: | US 11,183,526 B2 |
|---|---|---|---|
| | Ro et al. | (45) Date of Patent: | Nov. 23, 2021 |

(54) IMAGE SENSOR

(71) Applicant: SAMSUNG ELECTRONICS CO., LTD., Suwon-si (KR)

(72) Inventors: In Ho Ro, Gyeonggi-do (KR); Doowon Kwon, Seongnam-si (KR); Seokjin Kwon, Seoul (KR); Jameyung Kim, Seoul (KR); Jinyoung Kim, Suwon-si (KR); Sungki Min, Suwon-si (KR); Kwansik Cho, Hwaseong-si (KR); Mangeun Cho, Suwon-si (KR); Ho-Chul Ji, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 35 days.

(21) Appl. No.: 16/701,750

(22) Filed: Dec. 3, 2019

(65) Prior Publication Data

US 2020/0219912 A1  Jul. 9, 2020

(30) Foreign Application Priority Data

Jan. 8, 2019  (KR) .......................... 10-2019-0002080

(51) Int. Cl.
*H01L 21/00* (2006.01)
*H01L 27/146* (2006.01)

(52) U.S. Cl.
CPC .... *H01L 27/1463* (2013.01); *H01L 27/14603* (2013.01); *H01L 27/14612* (2013.01); *H01L 27/14636* (2013.01); *H01L 27/14621* (2013.01); *H01L 27/14627* (2013.01)

(58) Field of Classification Search
CPC ......... H01L 27/14643; H01L 27/14603; H01L 27/14612; H01L 27/14636; H01L 27/14621; H01L 27/14627
See application file for complete search history.

(56) References Cited

U.S. PATENT DOCUMENTS

| 9,184,086 B2 | 11/2015 | Park et al. |
| 9,942,461 B2 | 4/2018 | Kim et al. |
| 2017/0170229 A1* | 6/2017 | Oh .................... H01L 27/14621 |
| 2017/0207270 A1 | 7/2017 | Chen et al. |

(Continued)

FOREIGN PATENT DOCUMENTS

KR  1020140101154 A  8/2014

OTHER PUBLICATIONS

Chang-Rok Moon et al., "Application of Plasma-Doping (PLAD) Technique to Reduce Dark Current of CMOS Image Sensors", IEEE Electron Device Letters., vol. 28, No. 2, Feb. 2007.

*Primary Examiner* — Richard A Booth
(74) *Attorney, Agent, or Firm* — Volentine, Whitt & Francos, PLLC

(57) ABSTRACT

An image sensor including a semiconductor substrate having a first surface and a second surface, and a pixel region having a photoelectric conversion region; a first conductive pattern in a first trench defining the pixel region and extending from the first surface toward the second surface; a second conductive pattern in a second trench shallower than the first trench and defined between a plurality of active patterns on the first surface of the pixel region; a transfer transistor and a plurality of logic transistors on the active patterns; and a conductive line on the second surface and electrically connected to the first conductive pattern.

20 Claims, 26 Drawing Sheets

(56) References Cited

U.S. PATENT DOCUMENTS

2018/0063456 A1    3/2018  Lee
2018/0219040 A1*   8/2018  Choi ................. H01L 31/02161
2018/0286896 A1   10/2018  Kim et al.

* cited by examiner

IMAGE SENSOR

CROSS-REFERENCE TO RELATED APPLICATION

A claim of priority under 35 U. S. C. § 119 is made to Korean Patent Application No. 10-2019-0002080 filed on Jan. 8, 2019 in the Korean Intellectual Property Office, the entirety of which is hereby incorporated by reference.

BACKGROUND

The present inventive concepts relate to image sensors, and more particularly to complementary metal oxide semiconductor (CMOS) image sensors.

Image sensor convert photonic images into electrical signals. Recent advances in computer and communication industries have led to increased demand for high performance image sensors in various consumer electronic devices such as digital cameras, camcorders, personal communication systems (PCSs), game consoles, security cameras, and medical micro-cameras, for example.

Image sensors may be classified into charged coupled device (CCD) type and CMOS image sensor type. CMOS image sensors are typically easy to operate and small-sized as corresponding signal processing circuitry may be integrated into a single chip. Also, CMOS image sensors require relatively small power consumption, which is useful in battery-powered applications. In addition, since processing technology of CMOS image sensors is compatible with CMOS processing technology, the cost of fabrication of CMOS image sensors is comparatively low. Accordingly, CMOS image sensors have been increasingly used as a result of advances in technology and the increased demand for high resolution applications.

SUMMARY

Embodiments of the inventive concepts provide an image sensor with enhanced dark current characteristics.

Embodiments of the inventive concepts provide an image sensor including a semiconductor substrate having a first surface and a second surface, the semiconductor substrate including a pixel region having a photoelectric conversion region; a first conductive pattern in a first trench, the first trench defining the pixel region and extending from the first surface toward the second surface; a second conductive pattern in a second trench, the second trench being shallower than the first trench and defined between a plurality of active patterns on the first surface in the pixel region; a transfer transistor and a plurality of logic transistors on the active patterns; and a conductive line on the second surface and electrically connected to the first conductive pattern.

Embodiments of the inventive concepts further provide an image sensor including a semiconductor substrate having a first surface and a second surface, the semiconductor substrate including a pixel region having a photoelectric conversion region; a first device isolation structure having a grid structure surrounding the pixel region, the first device isolation structure including a first conductive pattern; a second device isolation structure in the pixel region, the second device isolation structure including a second conductive pattern; and a conductive line on the second surface and electrically connected to the first conductive pattern. Top surfaces of the first and second device isolation structures are coplanar with the first surface. A distance between a bottom surface of the first device isolation structure and the second surface is less than a distance between a bottom surface of the second device isolation structure and the second surface.

Embodiments of the inventive concepts still further provide an image sensor including a semiconductor substrate having a first surface and a second surface, the semiconductor substrate including a pixel region having a photoelectric conversion region; a first device isolation structure having a grid structure surrounding the pixel region, the first device isolation structure including a first conductive pattern and a first dielectric pattern on the first conductive pattern; and a second device isolation structure in the pixel region. The second device isolation structure includes a second conductive pattern and a second dielectric pattern on the second conductive pattern. Top surfaces of the first dielectric pattern and the second dielectric pattern are coplanar with the first surface. A distance between a top surface of the second conductive pattern and the first surface is less than a distance between a top surface of the first conductive pattern and the first surface.

Embodiments of the inventive concepts also provide an image sensor including a semiconductor substrate having a first surface and a second surface opposite the first surface, the semiconductor substrate including a pixel region having a photoelectric conversion region; a first device isolation structure surrounding the pixel region, the first device isolation structure including a first conductive pattern and a first dielectric pattern on the first conductive pattern; a second device isolation structure in the pixel region, the second device isolation structure including a second conductive pattern and a second dielectric pattern on the second conductive pattern; and a conductive line on the second surface and electrically connected to the first conductive pattern.

BRIEF DESCRIPTION OF THE DRAWINGS

The above noted and other features of the inventive concepts will be described hereinafter with reference to the accompanying drawings.

DETAILED DESCRIPTION

Example embodiments of the inventive concepts will now be described more fully with reference to the accompanying drawings.

It should be understood that the accompanying figures are intended to illustrate general characteristics of methods, structure and/or materials utilized in certain example embodiments and to supplement the written description hereinafter provided. These drawings are not however to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

Figure 1:
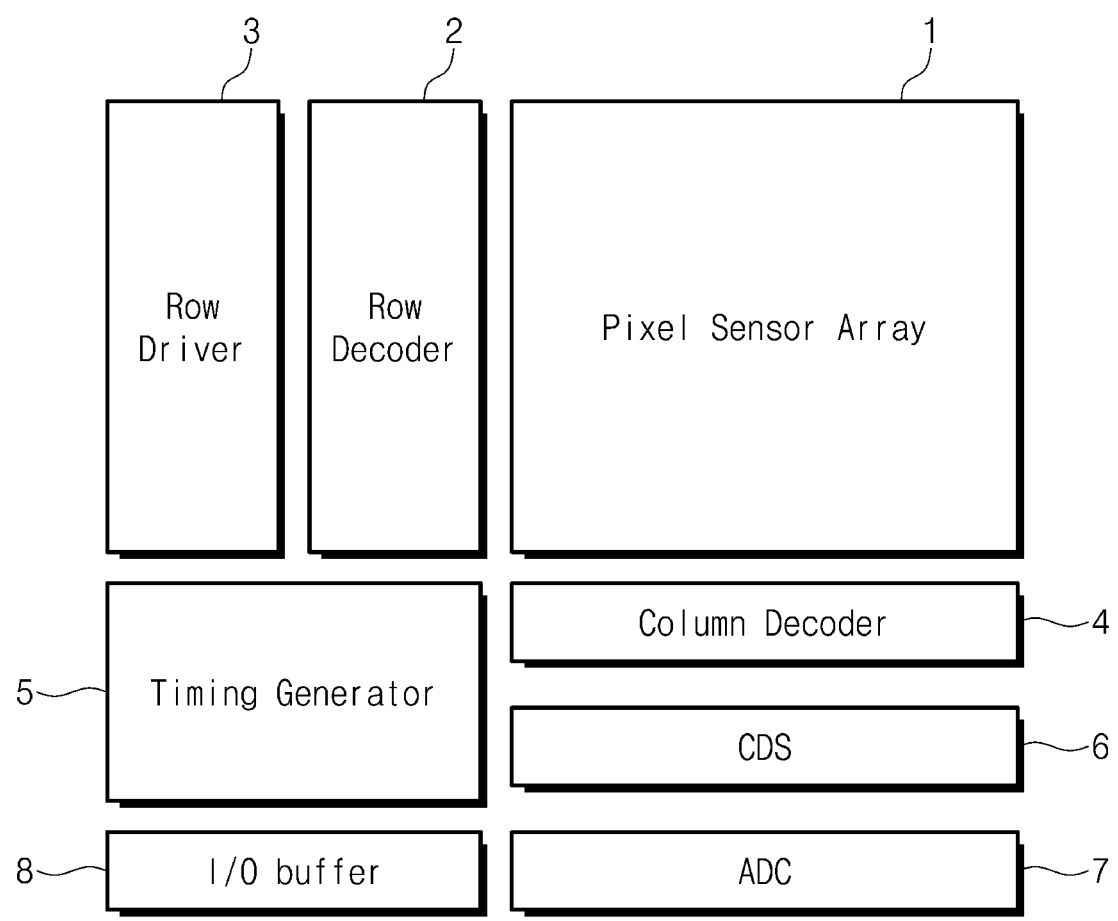
FIG. 1 illustrates a block diagram of an image sensor according to embodiments of the inventive concepts.

FIG. 1 illustrates a block diagram showing an image sensor according to embodiments of the inventive concepts.

Referring to FIG. 1, image sensor 1000 includes an active pixel sensor array 1, a row decoder 2, a row driver 3, a column decoder 4, a timing generator 5, a correlated double sampler (CDS) 6, an analog-to-digital converter (ADC) 7, and an input/output (I/O) buffer 8.

The active pixel sensor array 1 may include a plurality of two-dimensionally arranged unit pixels, each of which is configured to convert optical signals into electrical signals. The active pixel sensor array 1 may be driven by a plurality of driving signals such as a pixel selection signal, a reset signal, and a charge transfer signal from the row driver 3. The correlated double sampler 6 is provided with the converted electrical signals.

The row driver 3 provides the active pixel sensor array 1 with several of the driving signals for driving several unit pixels in accordance with a decoded result obtained from the row decoder 2. In the case that the unit pixels are arranged in a matrix shape, the driving signals may be provided for respective rows.

The timing generator 5 provides timing and control signals to the row decoder 2 and the column decoder 4.

The correlated double sampler 6 receives the electrical signals generated from the active pixel sensor array 1, and holds and samples the received electrical signals. The correlated double sampler 6 may perform a double sampling operation to sample a specific noise level and a signal level of the electrical signal, and outputs a difference level corresponding to a difference between the noise and signal levels.

The analog-to-digital converter 7 converts analog signals, which correspond to the difference level received from the correlated double sampler 6, into digital signals, and output the converted digital signals.

The input/output buffer 8 latches the digital signals and then sequentially outputs the latched digital signals to an image signal processing unit (not shown) in response to the decoded result obtained from the column decoder 4.

Figure 2:
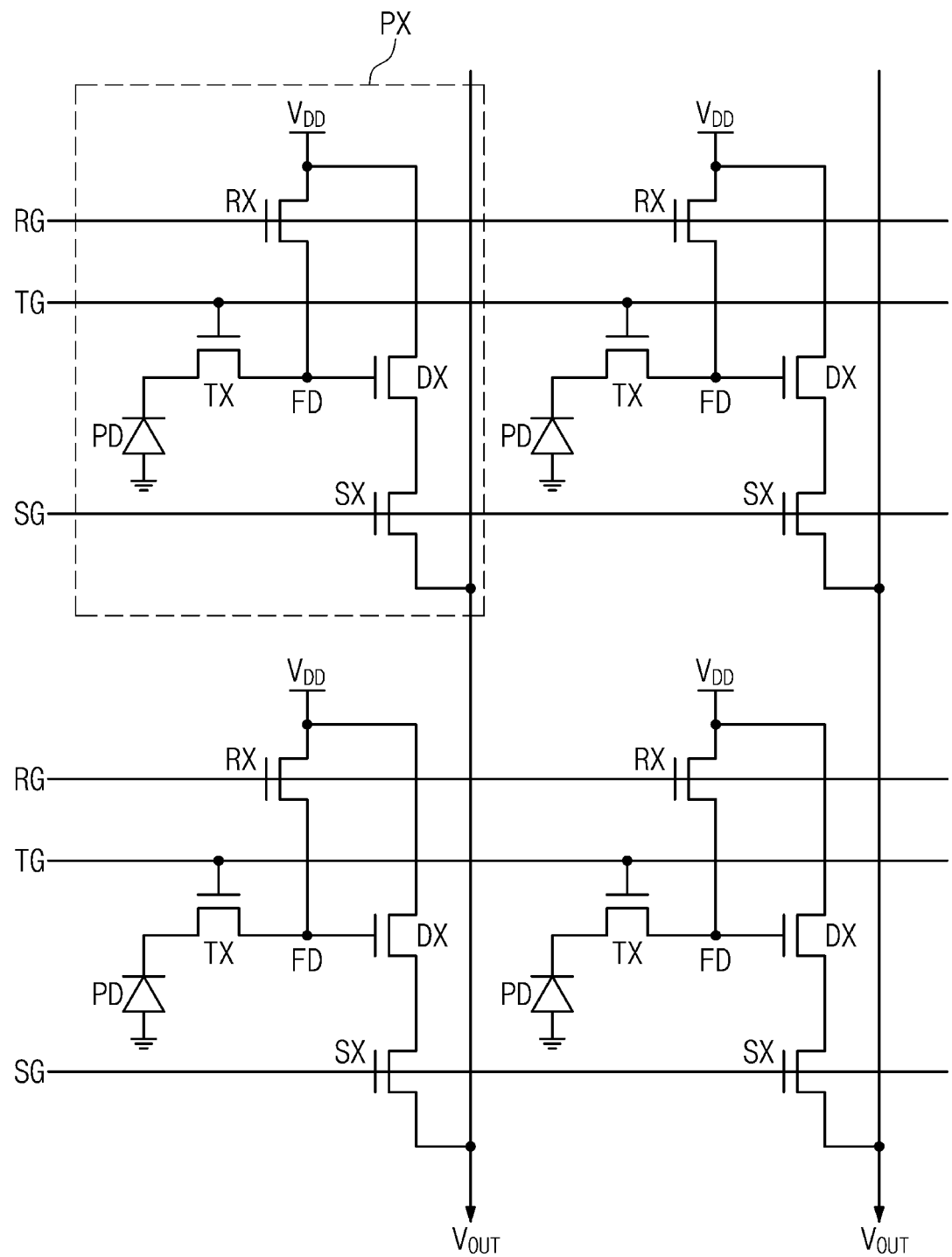
FIG. 2 illustrates a circuit diagram of an active pixel sensor array of an image sensor according to embodiments of the inventive concepts.

FIG. 2 illustrates a circuit diagram showing an active pixel sensor array of an image sensor according to embodiments of the inventive concepts.

Referring to FIGS. 1 and 2, sensor array 1 includes a plurality of unit pixels PX, which may be arranged in a matrix shape. Each of the unit pixels PX may include a transfer transistor TX and logic transistors RX, SX, and DX. In this case, the logic transistors RX, SX, and DX of FIG. 2 include a reset transistor RX, a select transistor SX, and a drive transistor DX. The transfer transistor TX includes a transfer gate TG, the select transistor SX includes a select gate SG and the reset transistor RX includes a reset gate RG. Each of the unit pixels PX further includes a photoelectric conversion device PD and a floating diffusion region FD.

The photoelectric conversion device PD may create and accumulate photo-charges in proportion to an amount of externally incident light. The photoelectric conversion device PD may for example include a photodiode, phototransistor, a photogate, a pinned photodiode, or a combination thereof. The transfer transistor TX may transfer charges generated in the photoelectric conversion device PD into the floating diffusion region FD. The floating diffusion region FD may accumulatively store the charges generated and transferred from the photoelectric conversion device PD. The drive transistor DX is controlled by an amount of photo-charges accumulated in the floating diffusion region FD.

The reset transistor RX may periodically reset the charges accumulated in the floating diffusion region FD. The reset transistor RX includes a drain electrode connected to the floating diffusion region FD and a source electrode connected to a power voltage $V_{DD}$. When the reset transistor RX is turned on, the floating diffusion region FD is supplied with the power voltage $V_{DD}$ connected to the source electrode of the reset transistor RX. Accordingly, when the reset transistor RX is turned on, the charges accumulated in the floating diffusion region FD may be exhausted and thus the floating diffusion region FD may be reset.

The drive transistor DX may serve as a source follower buffer amplifier. The drive transistor DX amplifies a variation in electrical potential of the floating diffusion region FD and outputs the amplified electrical potential to an output line $V_{OUT}$.

The select transistor SX may select each row of the unit pixels PX to be readout. When the select transistor SX is turned on, the power voltage $V_{DD}$ is applied to a drain electrode of the drive transistor DX.

Figure 3:
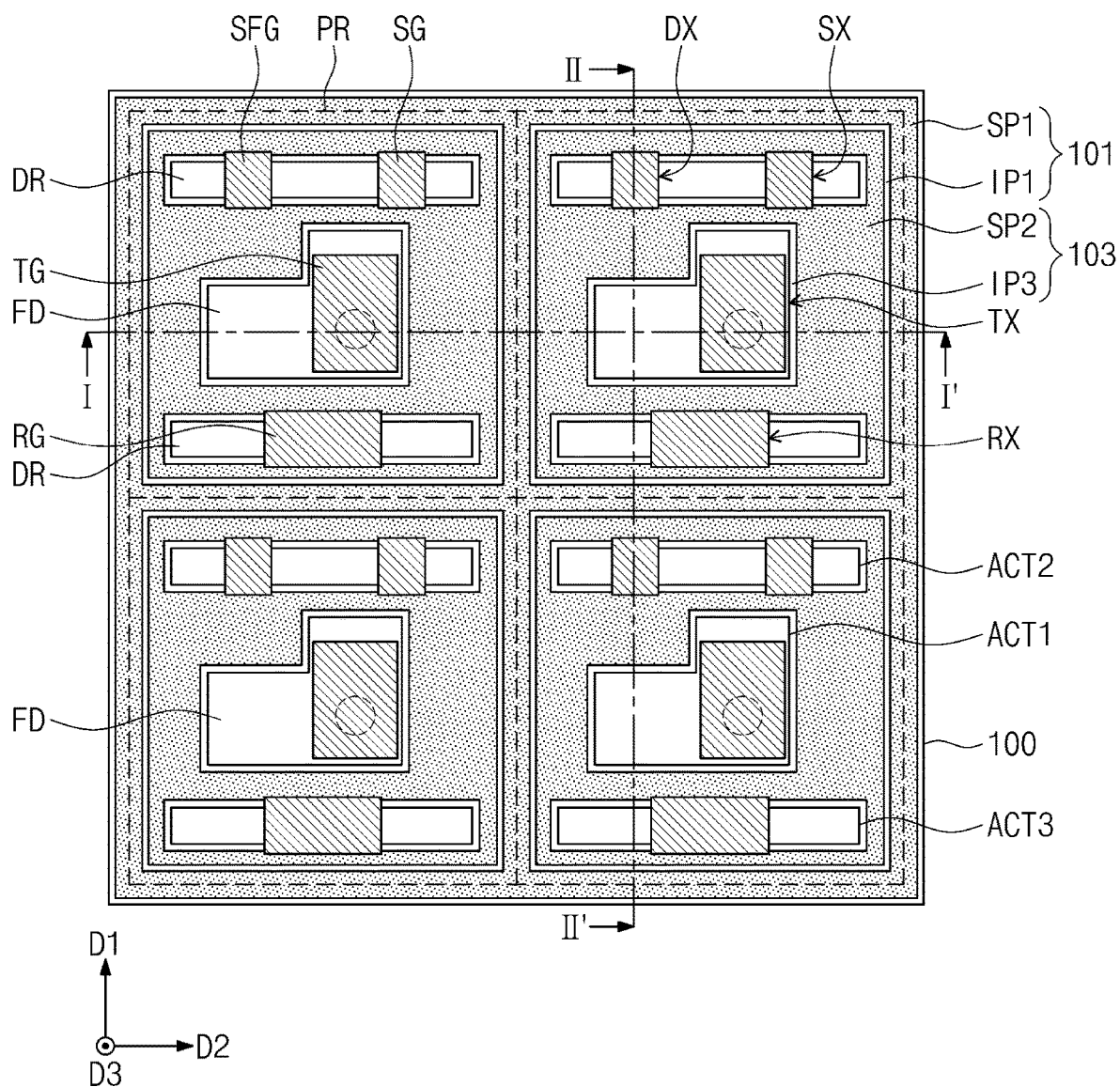
FIG. 3 illustrates a plan view of an image sensor according to embodiments of the inventive concepts.
Figure 4A:
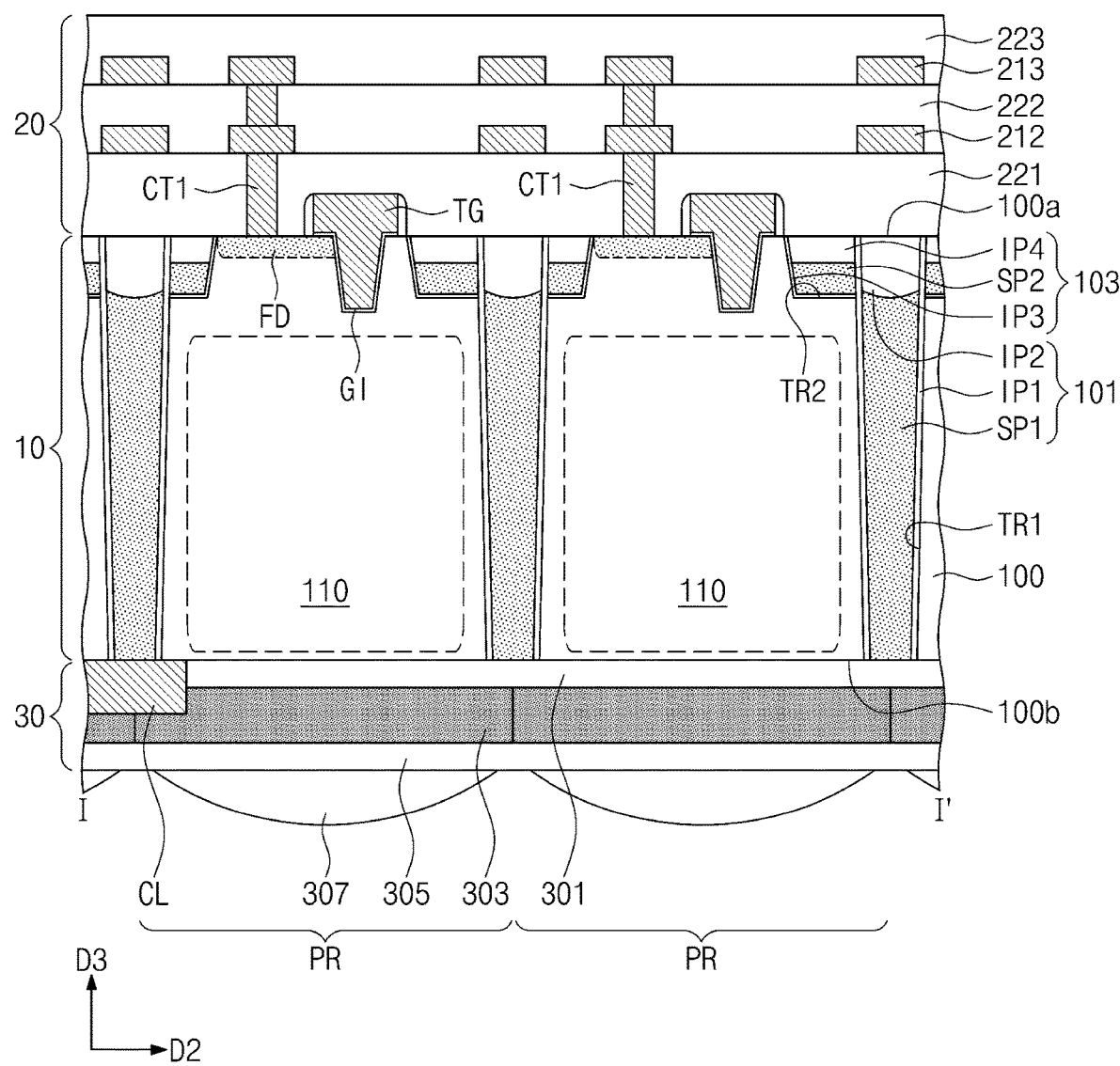
FIGS. 4A and 4B illustrate cross-sectional views respectively taken along lines I-I' and II-II' of FIG. 3.
Figure 4B:
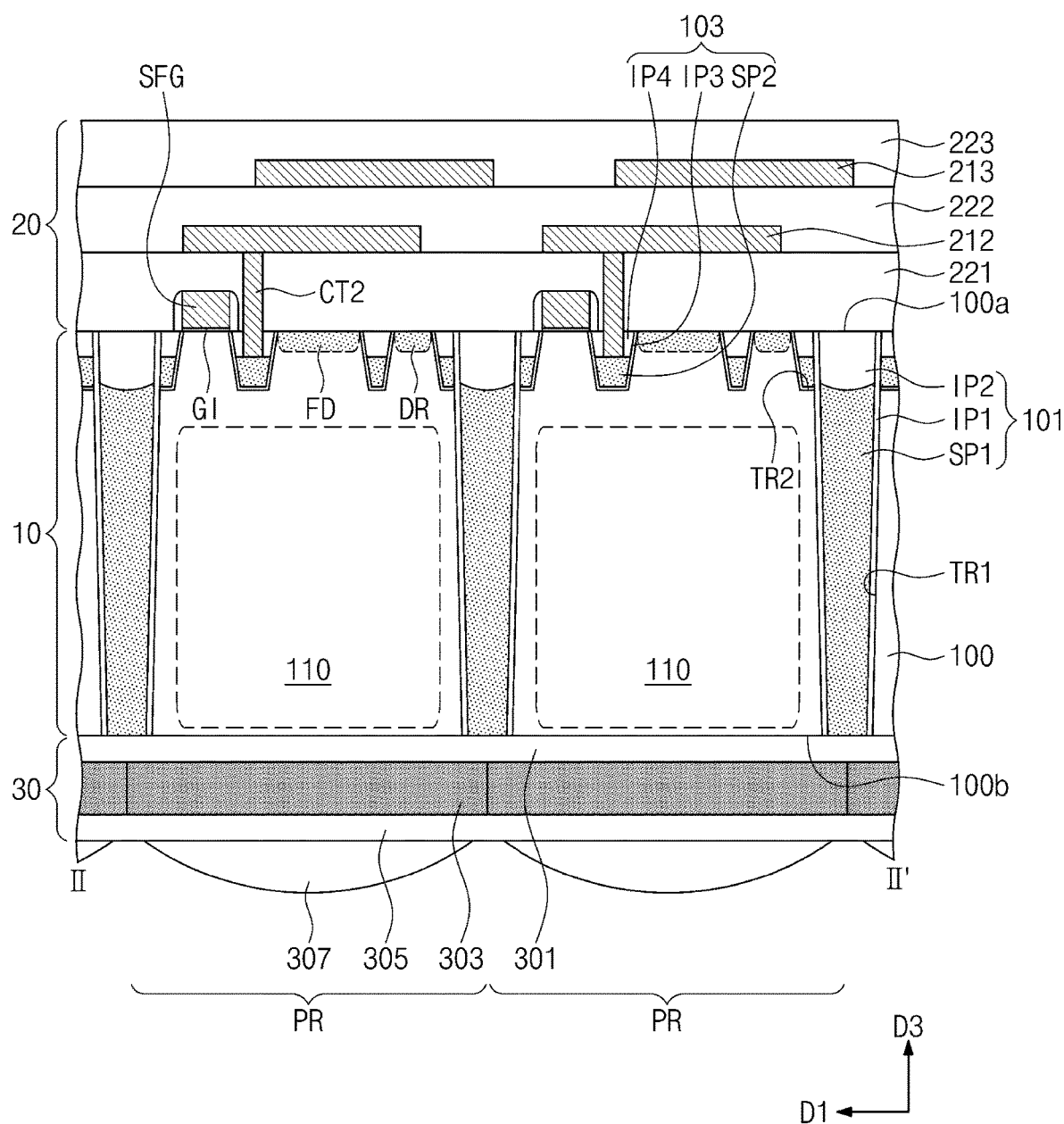

FIG. 3 illustrates a plan view of an image sensor according to embodiments of the inventive concepts. FIGS. 4A and 4B illustrate cross-sectional views respectively taken along lines I-I' and II-II' of FIG. 3.

Referring to FIGS. 3, 4A, and 4B, an image sensor according to some embodiments of the inventive concepts includes a photoelectric conversion layer 10, a connection line layer 20, and an optical transmittance layer 30. When viewed in cross-section, the photoelectric conversion layer 10 is disposed between the connection line layer 20 and the optical transmittance layer 30. The photoelectric conversion layer 10 may include a semiconductor substrate 100 and photoelectric conversion regions 110 provided in the semiconductor substrate 100. The photoelectric conversion regions 110 convert externally incident light into electrical signals.

The semiconductor substrate 100 has a first surface (or a front surface) 100a and a second surface (or a rear surface) 100b that face each other. The connection line layer 20 is disposed on the first surface 100a of the semiconductor substrate 100, and the optical transmittance layer 30 is disposed on the second surface 100b of the semiconductor substrate 100.

The semiconductor substrate 100 may be a substrate in which an epitaxial layer is formed on a bulk silicon substrate having a first conductive type (e.g., p-type) the same as that of the epitaxial layer. The bulk silicon substrate may be removed in fabricating an image sensor, and thus the semiconductor substrate 100 may include only the p-type epitaxial layer. As another example, the semiconductor substrate 100 may be a bulk semiconductor substrate having a well of the first conductive type. As still another example, the semiconductor substrate 100 may include various substrates, such as for example an n-type epitaxial layer, a bulk silicon substrate, and a silicon-on-insulator (SOI) substrate.

The semiconductor substrate 100 includes a plurality of pixel regions PR defined by a first device isolation structure 101. The pixel regions PR may correspond to the unit pixels PX of FIGS. 1 and 2. The pixel regions PR may be arranged in a matrix shape along first and second directions D1 and D2 intersecting each other. The first device isolation structure 101 prevents photo-charges generated from light incident onto each pixel region PR from randomly drifting into neighboring pixel regions PR. For example, the first device isolation structure 101 may suppress cross-talk phenomenon between the pixel regions PR.

When viewed in plan, the first device isolation structure 101 may have a grid structure. When viewed in plan, the first device isolation structure 101 may completely surround each of the pixel regions PR. For example, the first device isolation structure 101 may include first segments that extend in the second direction D2 and are spaced apart from each other in the first direction D1, and also second segments that extend in the first direction D1 and are spaced apart from each other in the second direction D2. A pair of first segments and a pair of second segments define the pixel region PR. For example, the pixel region PR is surrounded by a pair of first segments and a pair of second segments.

The first device isolation structure 101 extends along a third direction D3 from the first surface 100a toward the second surface 100b of the semiconductor substrate 100. The first device isolation structure 101 may penetrate the semiconductor substrate 100. For example, the first device isolation structure 101 may have a depth substantially the same as a vertical thickness of the semiconductor substrate 100. The first device isolation structure 101 may have a width that gradually decreases as approaching the second surface 100b from the first surface 100a of the semiconductor substrate 100.

The photoelectric conversion regions 110 are disposed in corresponding pixel regions PR. The photoelectric conversion regions 110 may be impurity regions doped with impurities of a second conductive type (e.g., n-type) opposite to that of the semiconductor substrate 100. For example, the photoelectric conversion regions 110 may be adjacent to the second surface 100b of the semiconductor substrate 100. The photoelectric conversion regions 110 may be disposed closer to the second surface 100b than to the first surface 100a.

Each of the photoelectric conversion regions 110 includes a first region adjacent to the first surface 100a and a second region adjacent to the second surface 100b. Impurity concentration of the first and second regions of the photoelectric conversion regions 110 may be different. Thus, a potential slope may exist between the first and second surfaces 100a and 100b of the photoelectric conversion regions 110 of the semiconductor substrate 100.

The semiconductor substrate 100 and the photoelectric conversion regions 110 together form photodiodes. For example, a photodiode may be constituted by a p-n junction between the semiconductor substrate 100 of the first conductive type and a photoelectric conversion region 110 of the second conductive type. The photoelectric conversion regions 110 constituting photodiodes may generate and accumulate photo-charges in proportion to intensity of incident light.

The semiconductor substrate 100 includes a second device isolation structure 103 provided on first surface 100a that defines first active patterns ACT1, second active patterns ACT2, and third active patterns ACT3. Each of the pixel regions PR includes the first active pattern ACT1, the second active pattern ACT2, and the third active pattern ACT3. The first active pattern ACT1, the second active pattern ACT2, and the third active pattern ACT3 are spaced apart from each other. The first active pattern ACT1, the second active pattern ACT2, and the third active pattern ACT3 may have different size with respect to each other. The first active pattern ACT1 as shown in FIG. 3 is disposed between the second active pattern ACT2 and the third active pattern ACT3.

When viewed in plan, the first active pattern ACT1 is disposed on a central area of the pixel region PR. The first active pattern ACT1 may have an L-shaped planar shape. When viewed in plan, each of the second and third active patterns ACT2 and ACT3 are disposed on an edge area of the pixel region PR. Each of the second and third active patterns ACT2 and ACT3 may have a linear shape extending in the second direction D2. It should be understood that the planar shapes of the first, second, and third active patterns ACT1, ACT2, and ACT3 are not limited to that shown in FIG. 3, but may be variously changed in other embodiments of the inventive concepts.

The second device isolation structure 103 may have a width that gradually decreases approaching the second surface 100b from the first surface 100a of the semiconductor substrate 100. The second device isolation structure 103 may have a bottom surface vertically spaced apart from the photoelectric conversion regions 110. The second device isolation structure 103 may have a depth less than that of the first device isolation structure 101. The first device isolation structure 101 may overlap a portion of the second device isolation structure 103.

Transfer transistors TX and logic transistors RX, SX, and DX identical or similar to those described with reference to FIG. 2 are provided on the first surface 100a of semiconductor substrate 100. The transfer transistor TX is provided on the first active pattern ACT1 of each of the pixel regions PR. The transfer transistor TX may be electrically connected to the photoelectric conversion region 110.

The transfer transistor TX includes a transfer gate TG and a floating diffusion region FD on the first active pattern ACT1. The transfer gate TG may include a lower segment inserted into the semiconductor substrate 100, and also an upper segment connected to the lower segment and protruding above the first surface 100a of the semiconductor substrate 100. A gate dielectric layer GI is interposed between the transfer gate TG and the semiconductor substrate 100. The floating diffusion region FD is placed in the first active pattern ACT1 on a side of the transfer gate TG. The floating diffusion region FD has the second conductive type (e.g., n-type) opposite to that of the semiconductor substrate 100.

The drive transistor DX and the select transistor SX are provided on the second active pattern ACT2 of each of the pixel regions PR. The drive transistor DX and the select transistor SX respectively include a drive gate SFG and a select gate SG on the second active pattern ACT2. The reset transistor RX as provided on the third active pattern ACT3 of each of the pixel regions PR. The reset transistor RX includes a reset gate RG on the third active pattern ACT3.

The gate dielectric layer GI is interposed between the semiconductor substrate 100 and each of the drive, select, and reset gates SFG, SG, and RG. Impurity regions DR may be provided on an upper portion of each of the second and third active patterns ACT2 and ACT3 on opposite sides of each of the drive, select, and reset gates SFG, SG, and RG. For example, the impurity regions DR may have the second conductive type (e.g., n-type) opposite to that of the semiconductor substrate 100.

The connection line layer 20 may include first, second, and third interlayer dielectric layers 221, 222 and 223, and also include first and second connection lines 212 and 213. The first interlayer dielectric layer 221 is provided on (over) the first surface 100a of the semiconductor substrate 100 as covering the transfer transistors TX and the logic transistors RX, SX, and DX. The first and second connection lines 212 and 213 may be disposed in the respective second and third interlayer dielectric layers 222 and 223 stacked on the first interlayer dielectric layer 221.

The first and second connection lines 212 and 213 may be electrically connected to the transfer transistors TX and the logic transistors RX, SX, and DX through first contacts CT1 penetrating the first interlayer dielectric layer 221. In certain embodiments, the first and second connection lines 212 and 213 may be arranged regardless of an arrangement of the photoelectric conversion regions 110. When viewed in plan, the first and second connection lines 212 and 213 may cross over the photoelectric conversion regions 110.

The optical transmittance layer 30 includes color filters 303 and micro-lenses 307. The optical transmittance layer 30 focuses and filters externally incident light, so that the photoelectric conversion layer 10 may be provided with the focused and filtered light.

For example, the color filters 303 and the micro-lenses 307 may be provided on the second surface 100b of the semiconductor substrate 100. The color filters 303 may be disposed on corresponding pixel regions PR. The micro-lenses 307 may be disposed on corresponding color filters 303. A first planarized layer 301 may be disposed between the color filters 303 and the second surface 100b of the semiconductor substrate 100, and a second planarized layer 305 may be disposed between the color filters 303 and the micro-lenses 307.

The color filters 303 may include primary-color filters. For example, the color filters 303 may include respective green-colored, red-colored, and blue-colored filters. The color filters 303 may be arranged in Bayer pattern format. As another example, the color filters 303 may include different colored filters such as respective cyan, magenta, or yellow colored filters.

The micro-lenses 307 may have convex shape to focus incident light onto the pixel regions PR. When viewed in plan, the micro-lenses 307 may overlap corresponding photoelectric conversion regions 110.

The first device isolation structure 101 and the second device isolation structure 103 will be described in detail hereinafter. A first trench TR1 is provided to define the pixel regions PR. The first trench TR1 penetrates the semiconductor substrate 100. When viewed in plan, the first trench TR1 may have a grid structure. The first device isolation structure 101 may fill the first trench TR1.

The first device isolation structure 101 includes a first conductive pattern SP1, a first dielectric pattern IP1, and a second dielectric pattern IP2. The first dielectric pattern IP1 covers an inner sidewall of the first trench TR1. The first conductive pattern SP1 and the second dielectric pattern IP2 may fill the first trench TR1. The second dielectric pattern IP2 may fill an upper portion of the first trench TR1, and the first conductive pattern SP1 may fill a remaining portion of the first trench TR1 other than the upper portion.

The second dielectric pattern IP2 may be adjacent to the first surface 100a, and have a top surface coplanar with the first surface 100a. The first conductive pattern SP1 may be adjacent to the second surface 100b, and have a bottom surface coplanar with the second surface 100b.

The first dielectric pattern IP1 is interposed between the first conductive pattern SP1 and the semiconductor substrate 100. The first dielectric pattern IP1 separates the first conductive pattern SP1 from the semiconductor substrate 100. The first dielectric pattern IP1 insulates the first conductive pattern SP1 from the semiconductor substrate 100. For example, the first conductive pattern SP1 may include n-type doped polysilicon or p-type doped polysilicon. Each of the first and second dielectric patterns IP1 and IP2 may for example include a silicon oxide layer, a silicon oxynitride layer, or a silicon nitride layer.

A conductive line CL may be provided on an area around the second surface 100b of the semiconductor substrate 100. The conductive line CL may be electrically connected to the first conductive pattern SP1 of the first device isolation structure 101. For example, the conductive line CL may be in direct contact with the bottom surface of the first conductive pattern SP1.

A negative voltage may be applied to the conductive line CL. For example, the conductive line CL may be electrically connected to a charge pump, and supplied with a negative voltage from the charge pump. The negative voltage may be applied as a constant voltage.

The first conductive pattern SP1 may be supplied with the negative voltage through the conductive line CL. When the first conductive pattern SP1 is supplied with the negative voltage, positive charges generated from the pixel region PR may thus be eliminated by the first conductive pattern SP1 surrounding the pixel region PR. As a result, dark current characteristics of the image sensor may be improved.

A second trench TR2 is provided to define the first, second, and third active patterns ACT1, ACT2, and ACT3 of the pixel region PR. The second trench TR2 may extend from the first surface 100a toward the second surface 100b. The second trench TR2 may be shallower than the first trench TR1. The second device isolation structure 103 may fill the second trench TR2. A bottom surface of the first device isolation structure 101 may be positioned closer to the second surface 100b than a bottom surface of the second device isolation structure 103 is positioned. That is, a distance between the bottom surface of the first device isolation structure 101 and the second surface 100b may be less than a distance between the bottom surface of the second device isolation structure 103 and the second surface 100b.

The second device isolation structure 103 includes a second conductive pattern SP2, a third dielectric pattern IP3, and a fourth dielectric pattern IP4. The third dielectric pattern IP3 covers an inner sidewall and a bottom surface of the second trench TR2. The second conductive pattern SP2 and the fourth dielectric pattern IP4 may fill the second trench TR2. The fourth dielectric pattern IP4 may fill an upper portion of the second trench TR2, and the second conductive pattern SP2 may fill a lower portion of the second trench TR2 other than the upper portion.

The fourth dielectric pattern IP4 may be adjacent to the first surface 100a, and have a top surface coplanar with the first surface 100a. The top surface of the fourth dielectric pattern IP4 may be coplanar with the top surfaces of the first and second dielectric patterns IP1 and IP2 of the first device isolation structure 101.

The third dielectric pattern IP3 is interposed between the second conductive pattern SP2 and the semiconductor substrate 100. The third dielectric pattern IP3 separates the second conductive pattern SP2 from the semiconductor substrate 100. The third dielectric pattern IP3 insulates the second conductive pattern SP2 from the semiconductor substrate 100.

The first dielectric pattern IP1 of the first device isolation structure 101 separates the second conductive pattern SP2 of the second device isolation structure 103 from the first conductive pattern SP1 of the first device isolation structure 101. The first dielectric pattern IP1 insulates the second conductive pattern SP2 from the first conductive pattern SP1. Because the second conductive pattern SP2 is not electrically connected to the first conductive pattern SP1, even if a negative voltage is applied to the first conductive pattern SP1, negative voltage is not applied from the first conductive pattern SP1 to the second conductive pattern SP2.

The second conductive pattern SP2 may include, for example, n-type doped polysilicon or p-type doped polysilicon. Each of the third and fourth dielectric patterns IP3 and IP4 may for example include a silicon oxide layer, a silicon oxynitride layer, or a silicon nitride layer.

The second conductive pattern SP2 and the first conductive pattern SP1 may have their top surfaces at different levels. The top surface of the second conductive pattern SP2 may be located at a higher level than that of the top surface of the first conductive pattern SP1. The top surface of the second conductive pattern SP2 may be closer to the first surface 100a than the top surface of the first conductive pattern SP1 is to the first surface 100a of the semiconductor substrate 100. That is, a distance between the top surface of the second conductive pattern SP2 and the first surface 100a may be less than a distance between the top surface of the first conductive pattern SP1 and the first surface 100a.

At least one second contact CT2 may be provided to penetrate the first interlayer dielectric layer 221 and the fourth dielectric pattern IP4 to have electrical connection with the second conductive pattern SP2. At least one first connection line 212 may be electrically connected through the at least one second contact CT2 to the second conductive pattern SP2. The second conductive pattern SP2 may be supplied with a negative voltage through the at least one first connection line 212 and the at least one second contact CT2. For example, similar to the conductive line CL, the at least one first connection line 212 may be electrically connected to a charge pump. With the second conductive pattern SP2 supplied with the negative voltage, positive charges generated from the pixel region PR may be eliminated not only by the first conductive pattern SP1 but also by the second conductive pattern SP2. As a result, dark current characteristics of the image sensor may be further improved.

Figure 5:
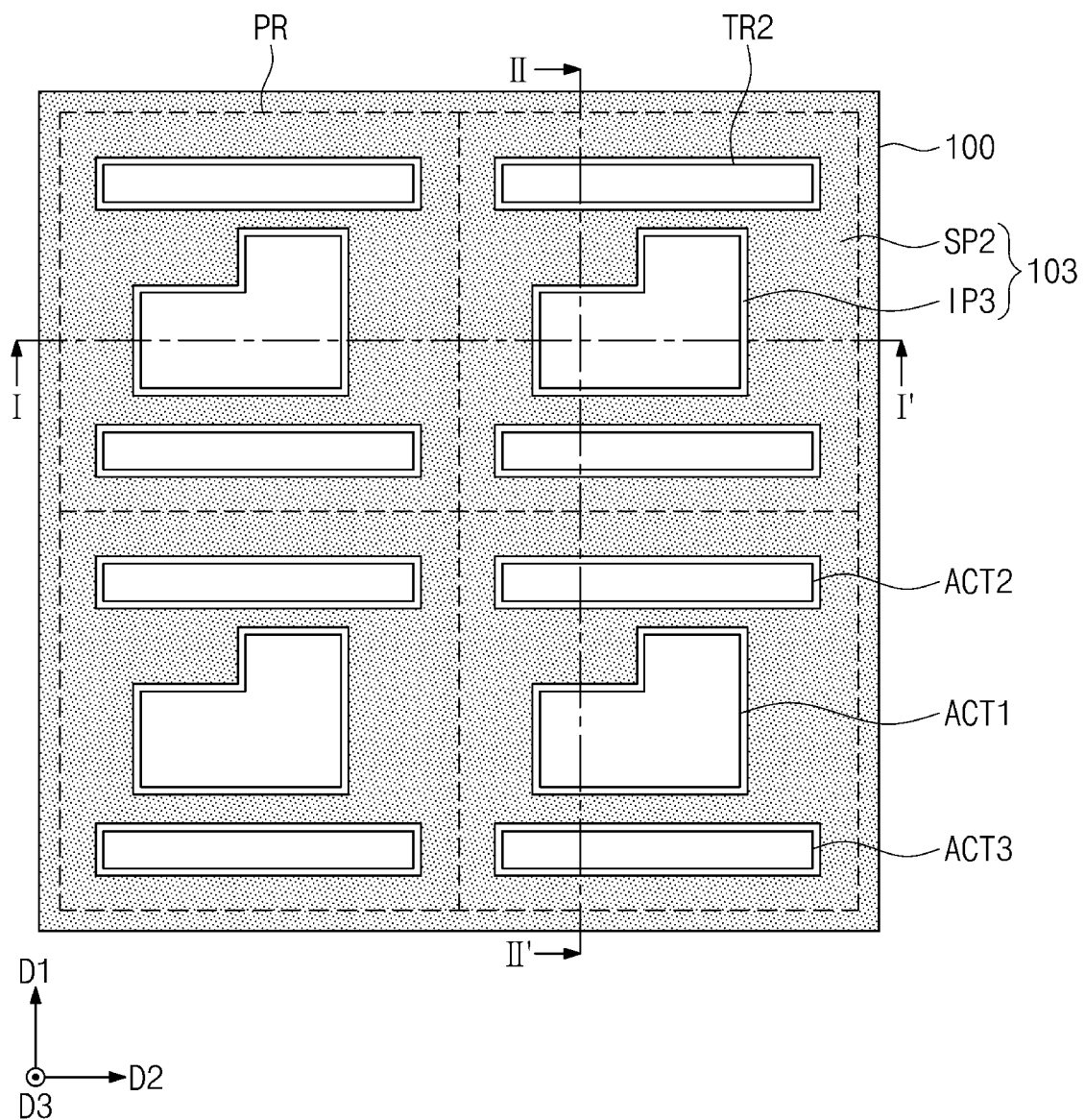
FIG. 5 illustrates a plan view of a method of fabricating an image sensor according to embodiments of the inventive concepts.
Figure 6A:
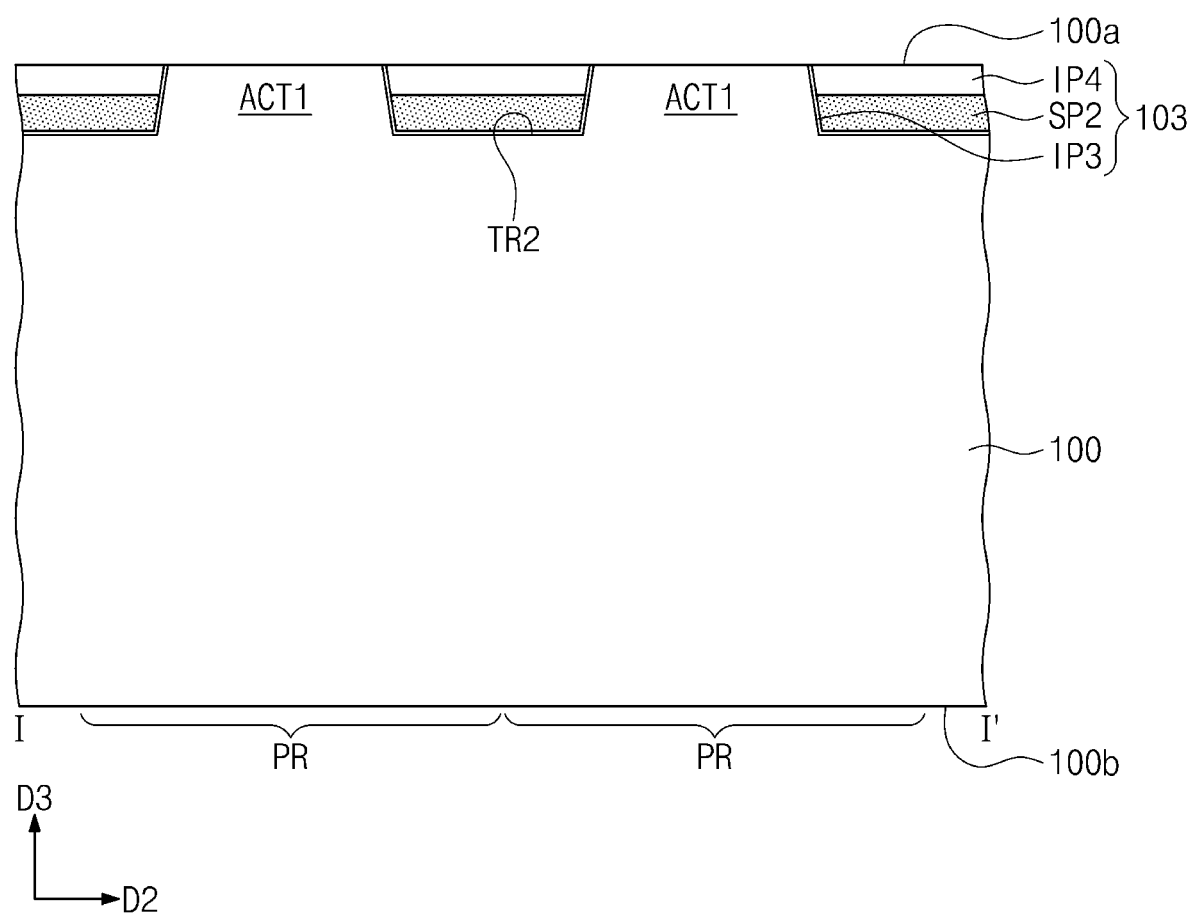
FIGS. 6A and 6B illustrate cross-sectional views respectively taken along line I-I' and line II-II' of FIG. 5.
Figure 6B:
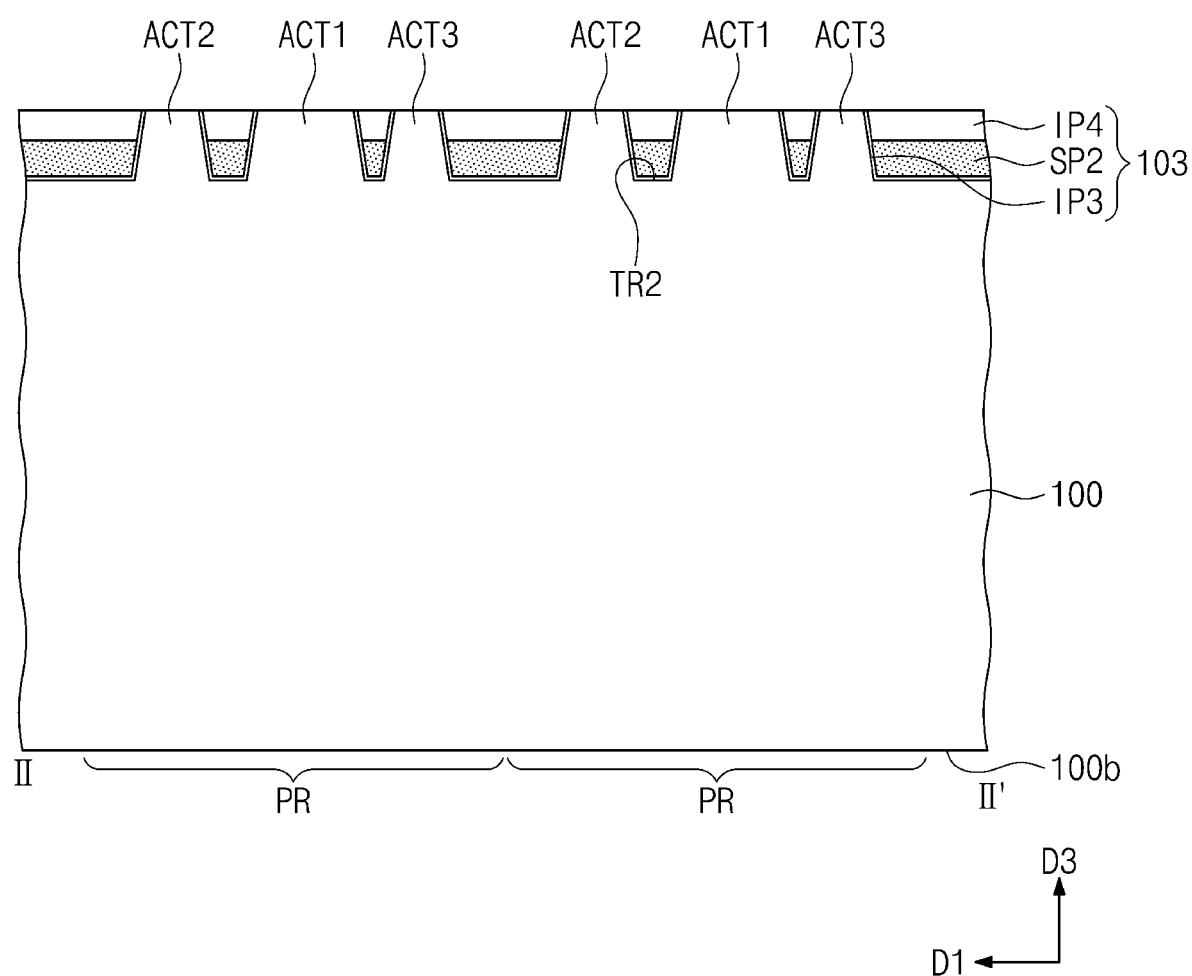
Figure 7:
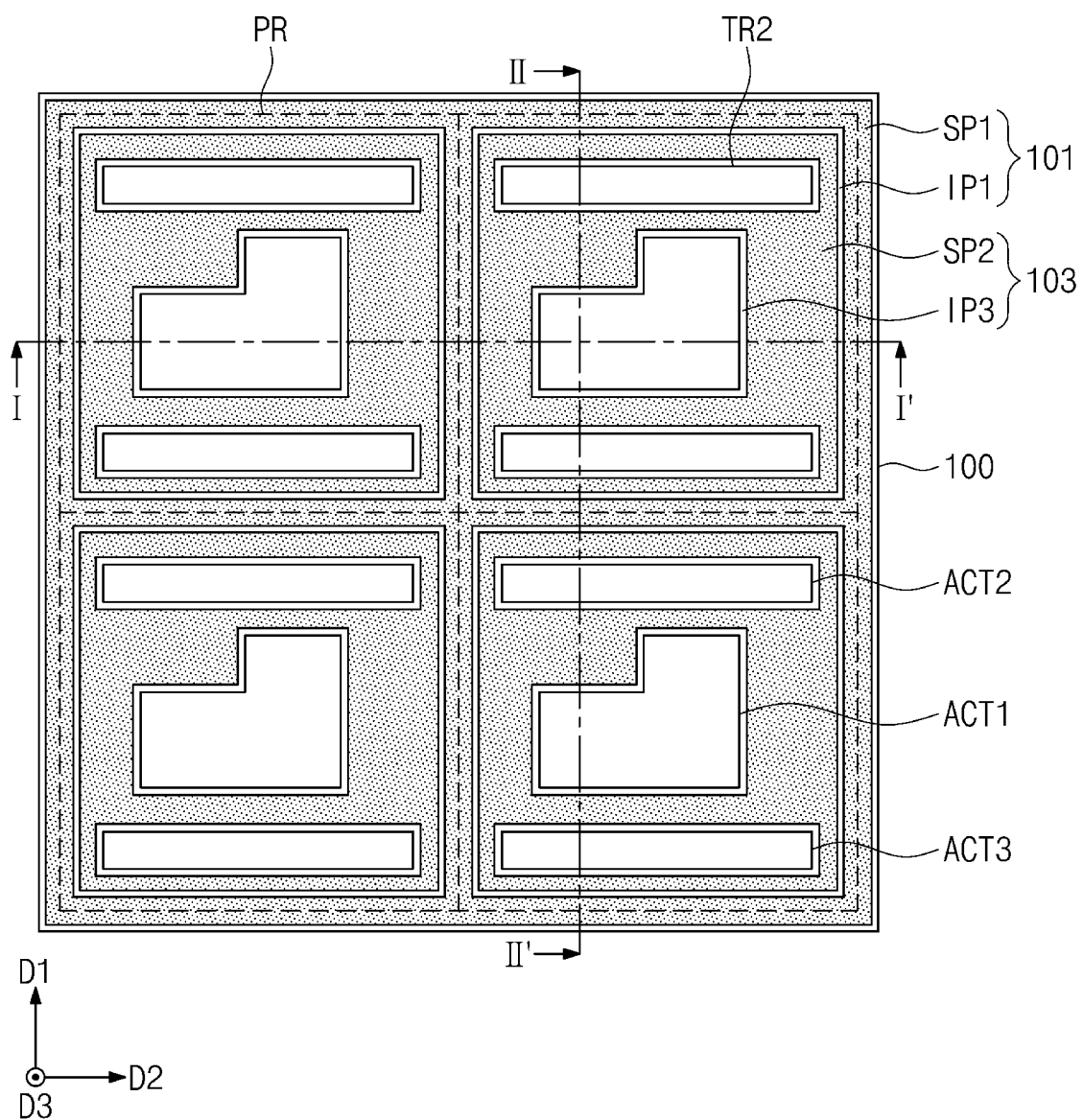
FIG. 7 illustrates a plan view of the method of fabricating an image sensor according to embodiments of the inventive concepts.
Figure 8A:
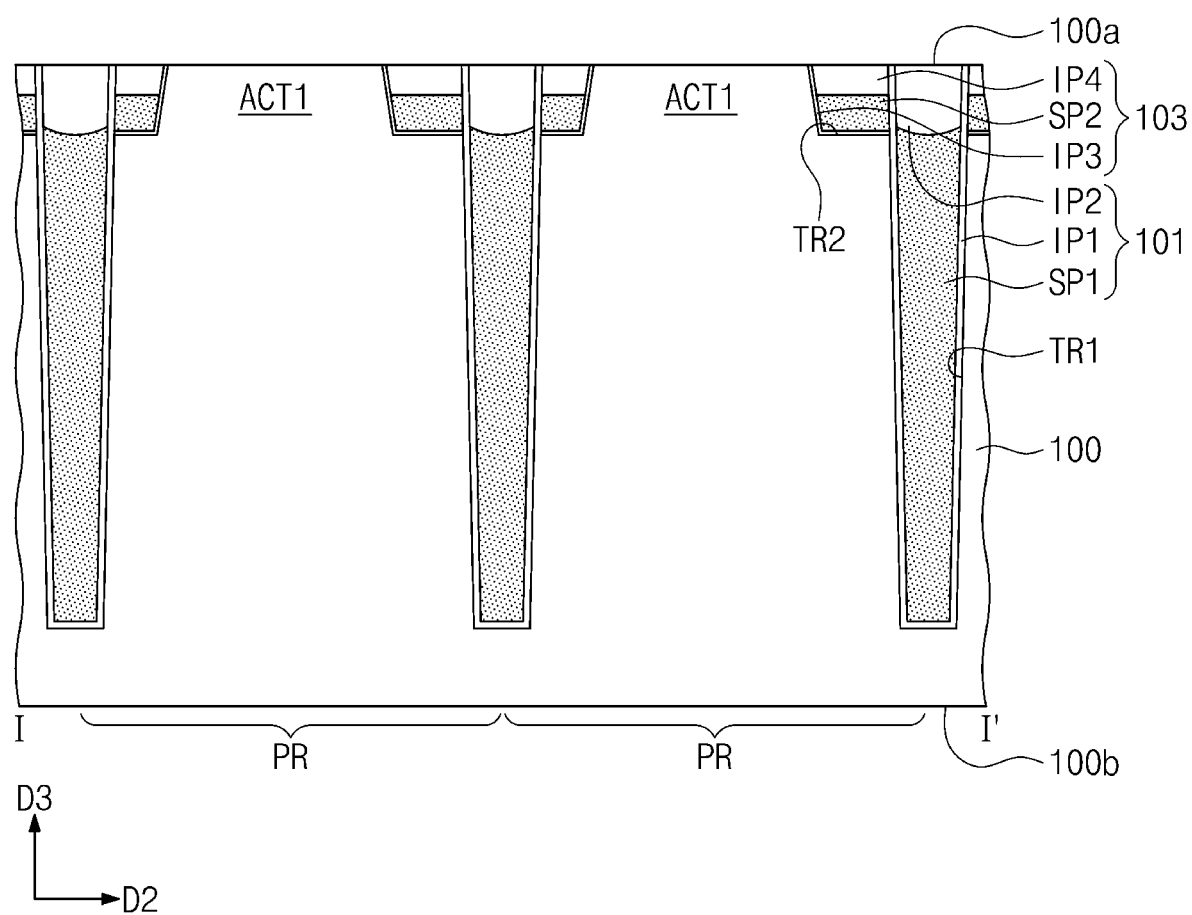
FIGS. 8A and 8B illustrate cross-sectional views respectively taken along line I-I' and line II-II' of FIG. 7.
Figure 8B:
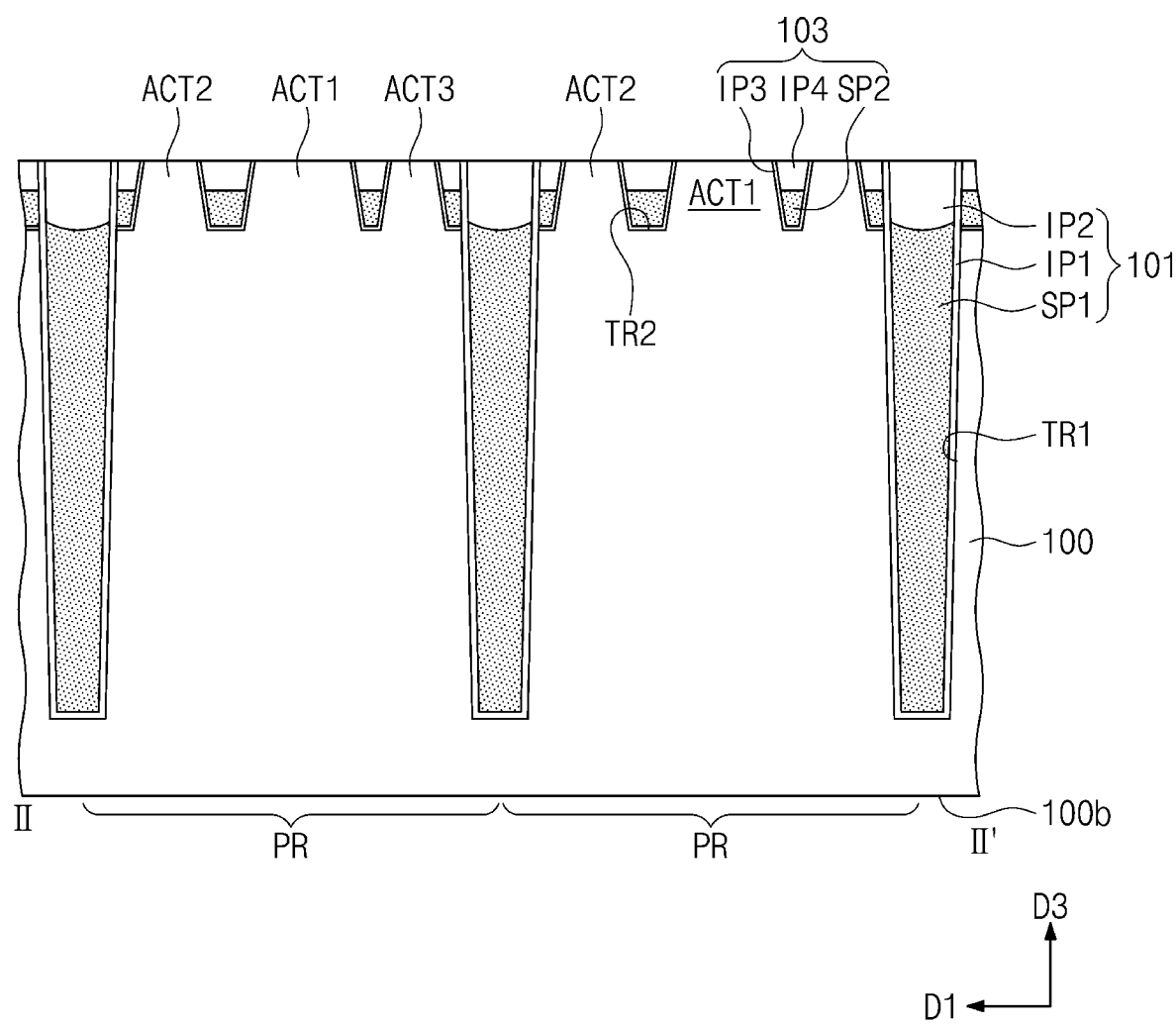
Figure 9:
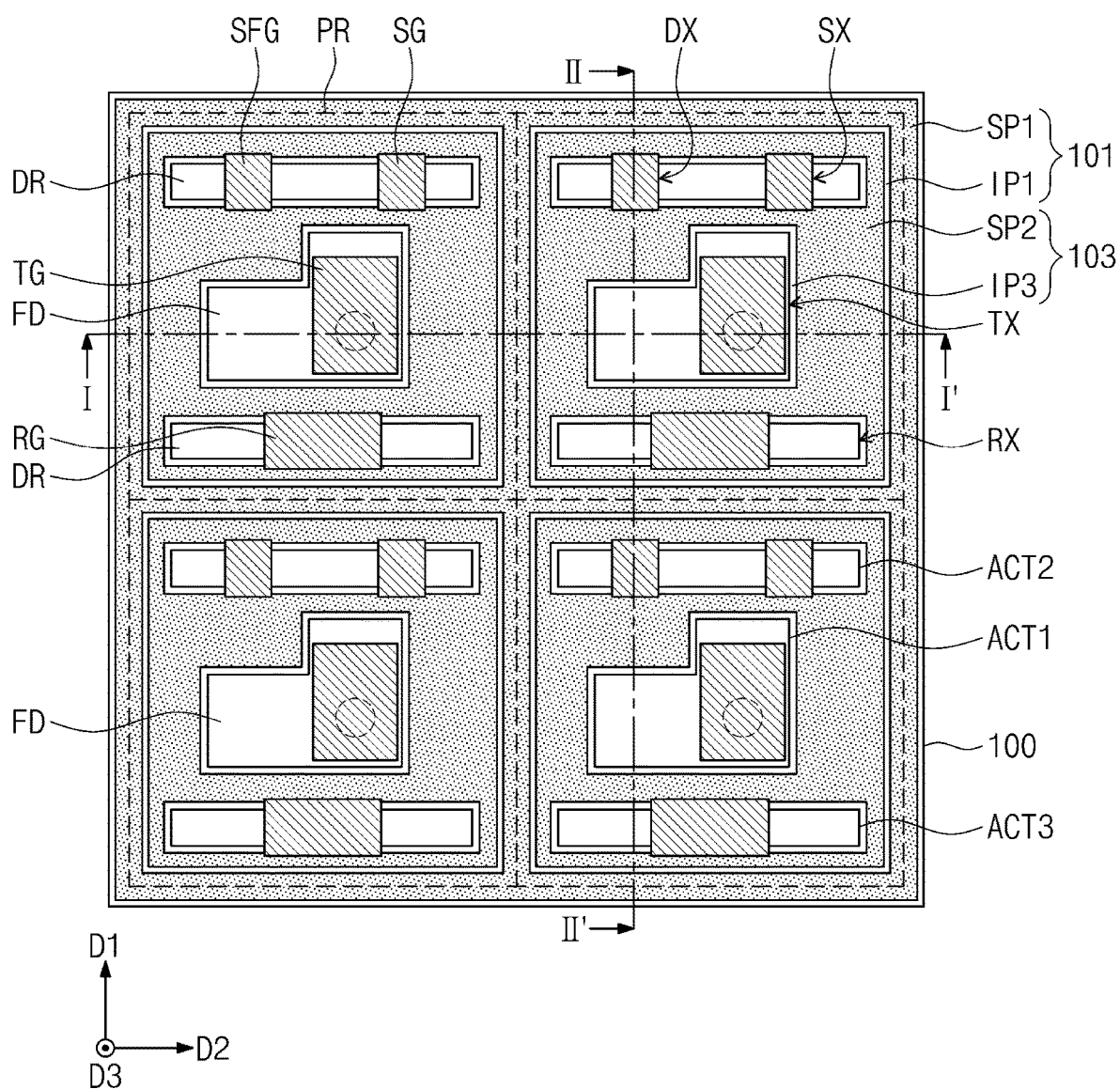
FIG. 9 illustrates a plan view of the method of fabricating an image sensor according to embodiments of the inventive concepts.
Figure 10A:
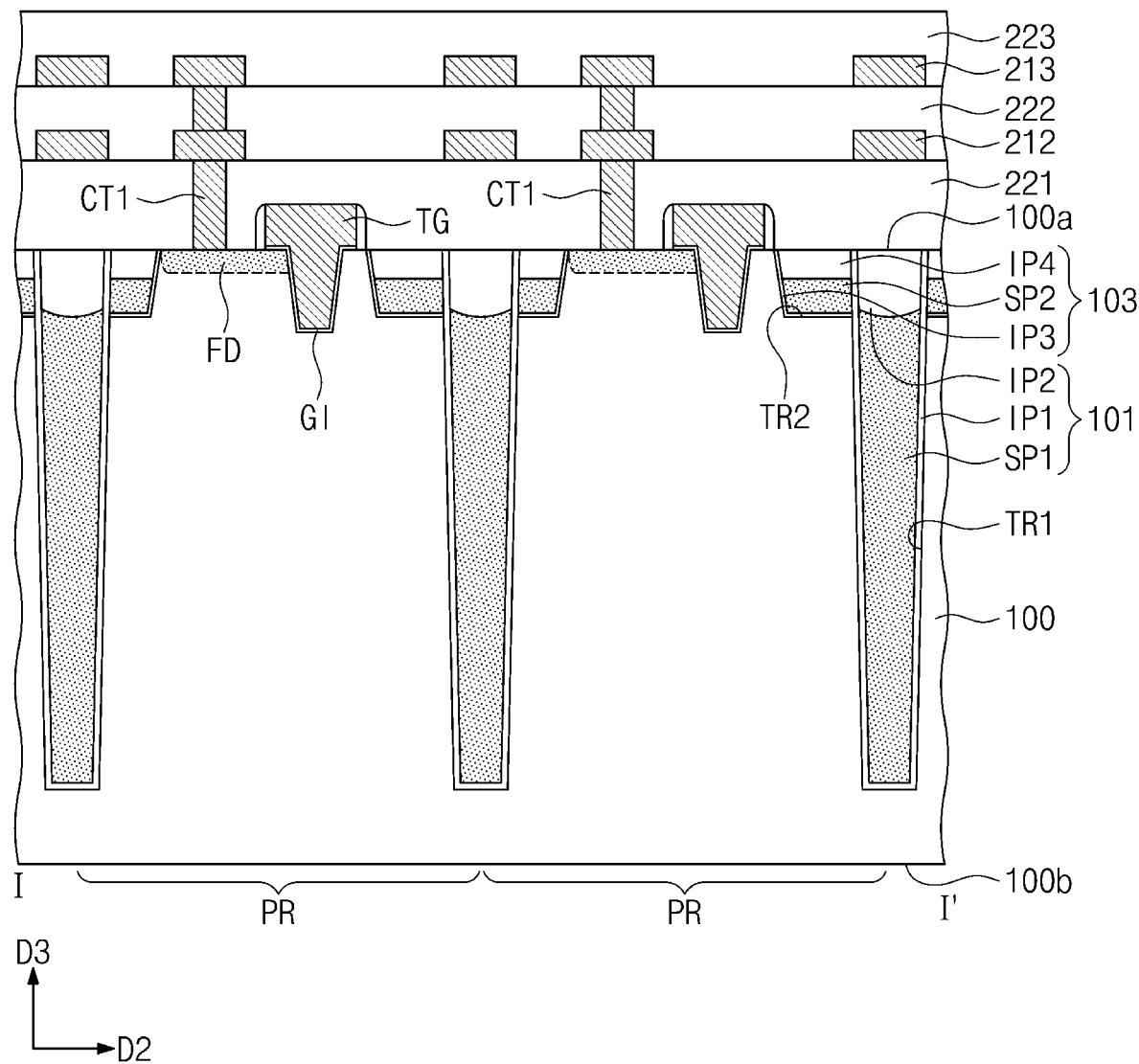
FIGS. 10A and 10B illustrate cross-sectional views respectively taken along line I-I' and line II-II' of FIG. 9.
Figure 10B:
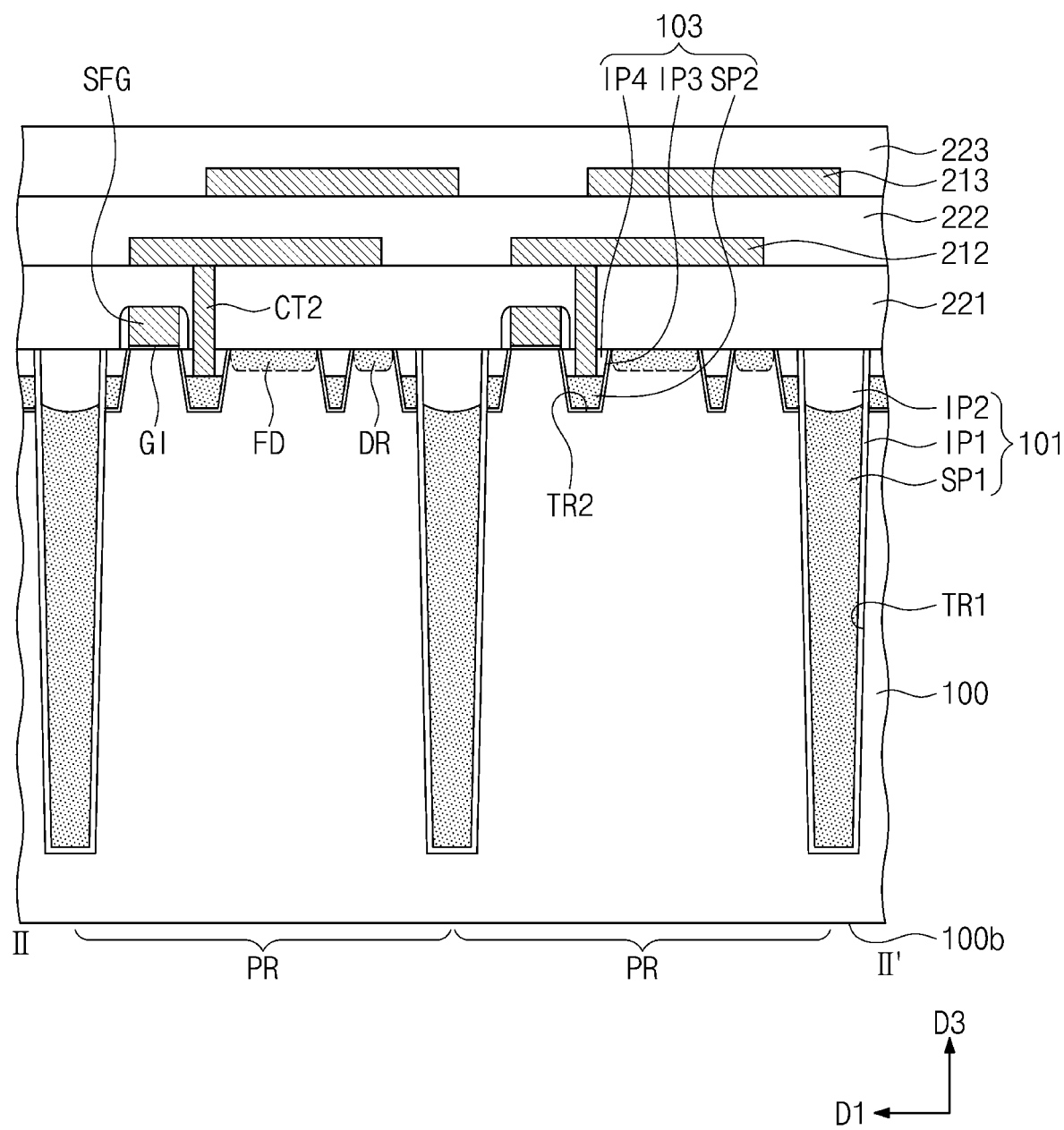

FIGS. 5, 7, and 9 illustrate plan views of a method of fabricating an image sensor according to embodiments of the inventive concepts. FIGS. 6A, 8A, and 10A illustrate cross-sectional views taken along line I-I' of FIGS. 5, 7, and 9, respectively. FIGS. 6B, 8B, and 10B illustrate cross-sectional views taken along line II-II' of FIGS. 5, 7, and 9, respectively.

Referring to FIGS. 5, 6A, and 6B, a semiconductor substrate 100 is provided as having a first surface 100a and a second surface 100b facing each other. The semiconductor substrate 100 may be doped with impurities to have a first conductive type (e.g., p-type).

A second device isolation structure 103 is formed on the first surface 100a of the semiconductor substrate 100. For example, the first surface 100a of the semiconductor substrate 100 may be patterned to form a second trench TR2 defining first, second, and third active patterns ACT1, ACT2, and ACT3. By formation of the second trench TR2, the semiconductor substrate 100 is recessed at first surface 100a at positions other than the first, second, and third active patterns ACT1, ACT2, and ACT3.

A third dielectric pattern IP3 is formed to partially fill the second trench TR2. The formation of the third dielectric pattern IP3 may include conformally forming a first dielectric layer on the first surface 100a of the semiconductor substrate 100. The third dielectric pattern IP3 may cover an inner sidewall and a bottom surface of the second trench TR2. The first dielectric layer may include, for example, a silicon oxide layer, a silicon oxynitride layer, or a silicon nitride layer.

A second conductive pattern SP2 is formed on the third dielectric pattern IP3. The formation of the second conductive pattern SP2 may include forming a first conductive layer filling the second trench TR2 and performing an etch-back process on the first conductive layer. The second conductive pattern SP2 thus fills a lower portion of the second trench TR2. The second conductive pattern SP2 may have a top surface lower than top surfaces of the first, second, and third active patterns ACT1, ACT2, and ACT3. The first conductive layer may include, for example, n-type doped polysilicon or p-type doped polysilicon.

A fourth dielectric pattern IP4 is formed on the second conductive pattern SP2. The formation of the fourth dielectric pattern IP4 may include forming a second dielectric layer filling an upper portion of the second trench TR2. The second dielectric layer may include, for example, a silicon oxide layer, a silicon oxynitride layer, or a silicon nitride layer. The first dielectric layer and the second dielectric layer may undergo a planarization process that is performed until the top surfaces of the first, second, and third active patterns ACT1, ACT2, and ACT3 are exposed. Thus, the first dielectric layer and the second dielectric layer may be respectively formed into the third dielectric pattern IP3 and the fourth dielectric pattern IP4. The second device isolation structure 103 may be constituted by the second conductive pattern SP2, the third dielectric pattern IP3, and the fourth dielectric pattern IP4 that are formed in the second trench TR2.

Referring to FIGS. 7, 8A, and 8B, a first device isolation structure 101 is formed on the first surface 100a of the semiconductor substrate 100. For example, the first surface 100a of the semiconductor substrate 100 may be patterned to form a first trench TR1 defining pixel regions PR. The pixel regions PR may be two-dimensionally arranged in a first direction D1 and a second direction D2 that intersect each other. By formation of the first trench TR1, the second device isolation structure 103 is partially etched. The first trench TR1 is formed to penetrate a portion of the second device isolation structure 103. When viewed in plan, the first trench TR1 may be formed as a grid structure.

The first trench TR1 extends from the first surface 100a toward the second surface 100b. For example, the first trench TR1 may have a width that gradually decreases approaching the second surface 100b from the first surface 100a. The first trench TR1 is deeper than the second trench TR2 filled with the second device isolation structure 103. The first trench TR1 has a bottom surface vertically spaced apart from the second surface 100b.

A first dielectric pattern IP1 is formed to partially fill the first trench TR1. The formation of the first dielectric pattern IP1 may include conformally forming a third dielectric layer on the first surface 100a of the semiconductor substrate 100. The first dielectric pattern IP1 may cover an inner sidewall and the bottom surface of the first trench TR1. The third dielectric layer may include, for example, a silicon oxide layer, a silicon oxynitride layer, or a silicon nitride layer.

A first conductive pattern SP1 is formed on the first dielectric pattern IP1. The formation of the first conductive pattern SP1 may include forming a second conductive layer filling the first trench TR1 and performing an etch-back process on the second conductive layer. The first conductive pattern SP1 thus fills a lower portion of the first trench TR1. For example, the first conductive pattern SP1 may fill a remaining portion of the first trench TR1 other than an upper portion of the first trench TR1. The first conductive pattern SP1 has a top surface lower than top surfaces of the first, second, and third active patterns ACT1, ACT2, and ACT3. The top surface of the first conductive pattern SP1 may be lower than that of the second conductive pattern SP2. The second conductive layer may include, for example, n-type doped polysilicon or p-type doped polysilicon.

A second dielectric pattern IP2 is formed on the first conductive pattern SP1. The formation of the second dielectric pattern IP2 may include forming a fourth dielectric layer filling an upper portion of the first trench TR1. The fourth dielectric layer may include, for example, a silicon oxide layer, a silicon oxynitride layer, or a silicon nitride layer. The third dielectric layer and the fourth dielectric layer may undergo a planarization process that is performed until the top surfaces of the first, second, and third active patterns ACT1, ACT2, and ACT3 are exposed, and thus may be respectively formed into the first dielectric pattern IP1 and the second dielectric pattern IP2. The first device isolation structure 101 may be constituted by the first conductive pattern SP1, the first dielectric pattern IP1, and the second dielectric pattern IP2 that are formed in the first trench TR1.

Referring to FIGS. 9, 10A, and 10B, on each of the pixel regions PR, a transfer transistor TX is formed on the first active pattern ACT1, a drive transistor DX and a select transistor SX are formed on the second active pattern ACT2, and a reset transistor RX is formed on the third active pattern ACT3.

For example, the formation of the transfer transistor TX may include implanting the first active pattern ACT1 with impurities to form a floating diffusion region FD, and forming a transfer gate TG on the first active pattern ACT1. The formation of the drive transistor DX and the select transistor SX may include implanting the second active pattern ACT2 with impurities to form an impurity region DR, and forming a drive gate SFG and a select gate SG on the second active pattern ACT2. The formation of the reset transistor RX may include implanting the third active pattern ACT3 with impurities to form an impurity region DR, and forming a reset gate RG on the third active pattern ACT3.

A first interlayer dielectric layer 221 is formed on the first surface 100a of the semiconductor substrate 100. The first interlayer dielectric layer 221 may be formed to cover the transfer transistors TX and the logic transistors RX, SX, and DX formed on the first surface 100a of the semiconductor substrate 100.

Second and third interlayer dielectric layers 222 and 223 are sequentially formed on the first interlayer dielectric layer 221. First and second connection lines 212 and 213 may be respectively formed in the second and third interlayer dielectric layers 222 and 223. First contacts CT1 may be formed to electrically connect the first and second connection lines 212 and 213 to the transfer transistors TX and the logic transistors RX, SX, and DX. At least one second contact CT2 may be formed to electrically connect at least one first connection line 212 to the second conductive pattern SP2.

Referring back to FIGS. 3, 4A, and 4B, a planarization process is performed on the second surface 100b of the semiconductor substrate 100 until the first conductive pattern SP1 of the first device isolation structure 101 is exposed. The semiconductor substrate 100 may thus have reduced thickness. The first device isolation structure 101 may thus have a depth the same as a thickness of the semiconductor substrate 100.

The pixel regions PR are implanted with impurities to form photoelectric conversion regions 110 on corresponding pixel regions PR. The photoelectric conversion regions 110 may have a second conductive type (e.g., n-type) different from the first conductive type (e.g., p-type).

A first planarized layer 301 may be formed on the second surface 100b of the semiconductor substrate 100. A conductive line CL is formed on an area around the second surface 100b of the semiconductor substrate 100. The conductive line CL is electrically connected to the first conductive pattern SP1 of the first device isolation structure 101.

Color filters 303 may be formed on the first planarized layer 301. The color filters 303 may be formed on corresponding pixel regions PR. A second planarized layer 305 may be formed on the color filters 303. Micro-lenses 307 may be formed on the second planarized layer 305. The micro-lenses 307 may be formed on corresponding color filters 303.

Figure 11:
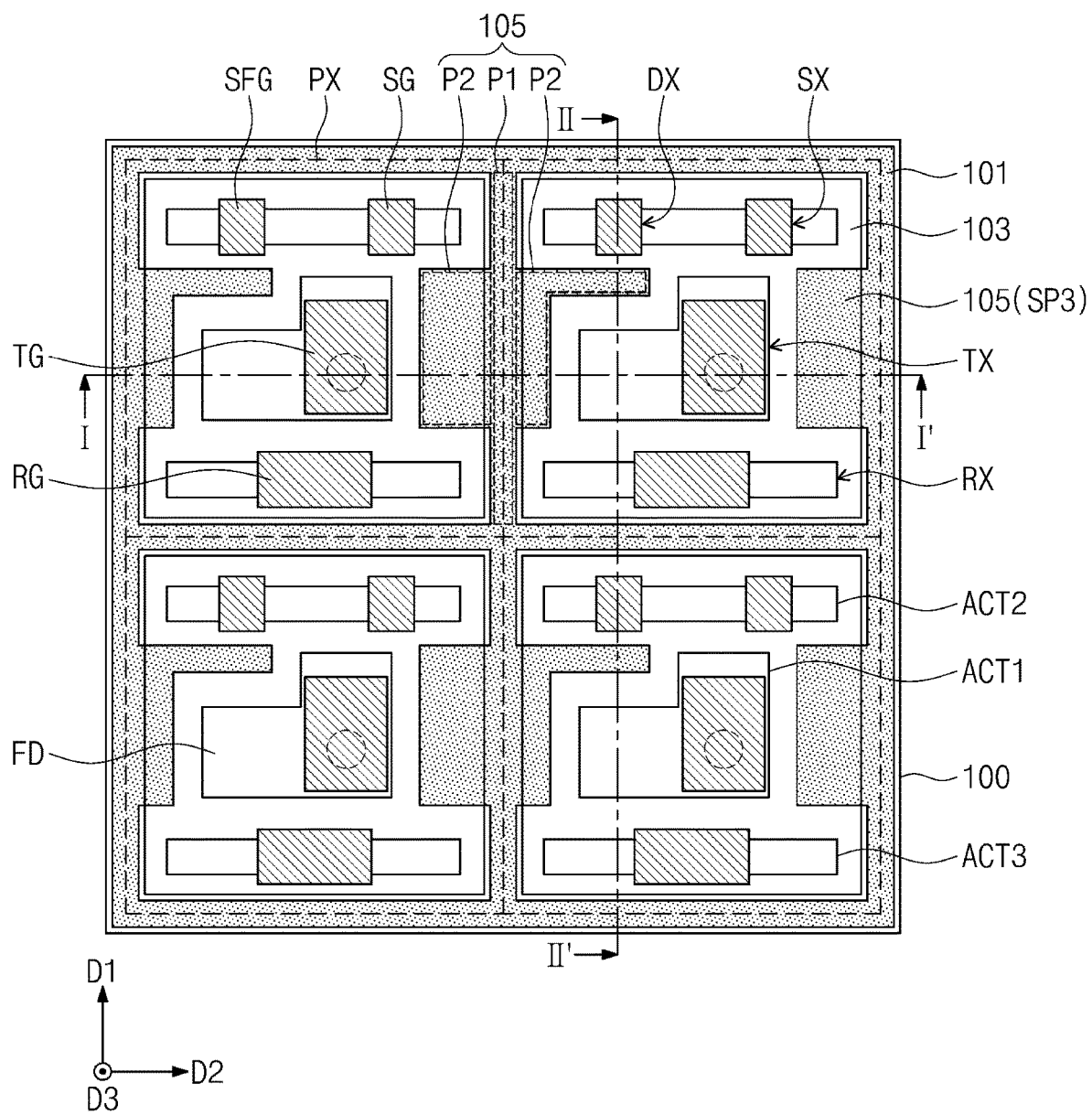
FIG. 11 illustrates a plan view showing an image sensor according to other embodiments of the inventive concepts.
Figure 12A:
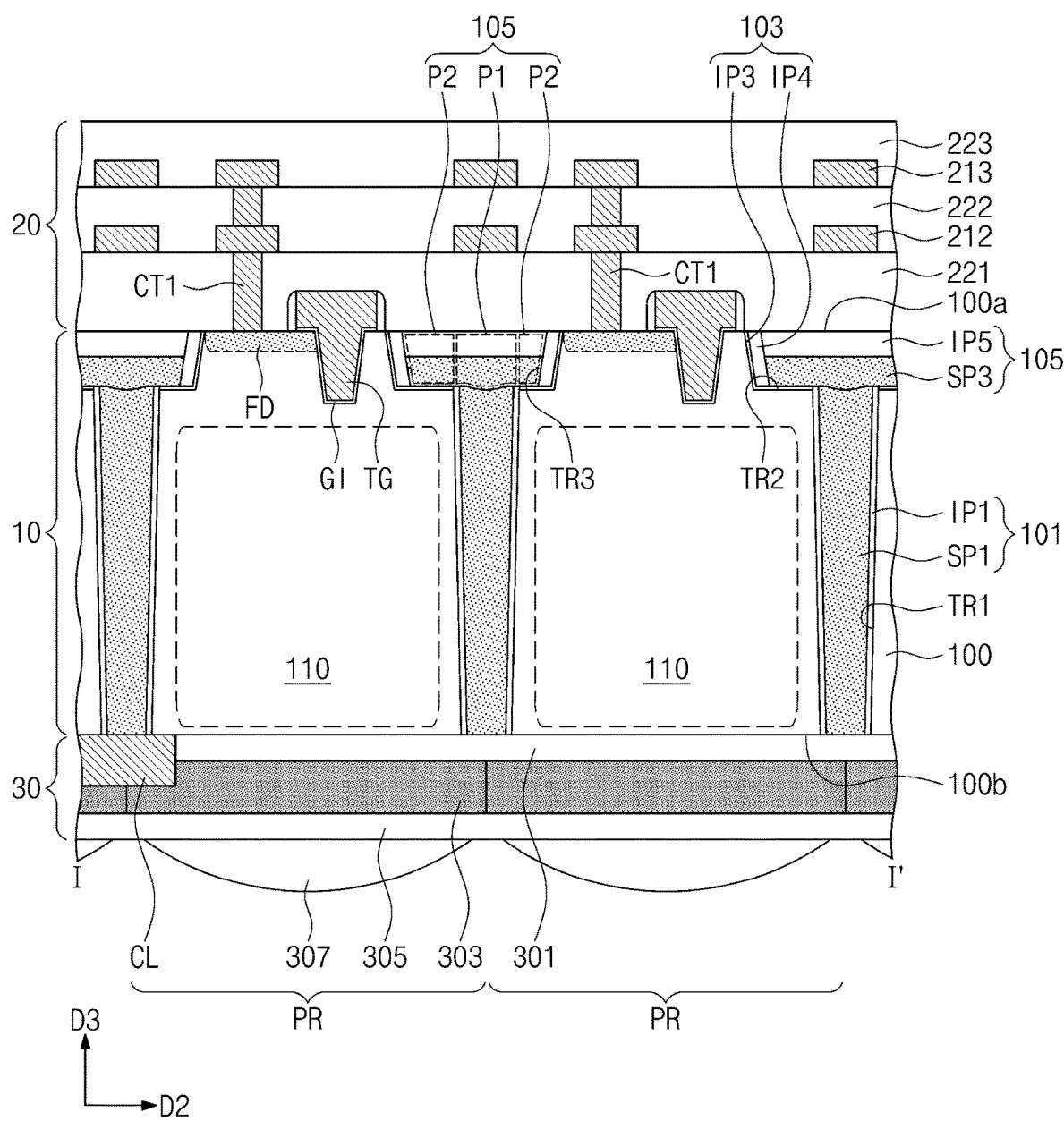
FIGS. 12A and 12B illustrate cross-sectional views respectively taken along lines I-I' and II-II' of FIG. 11.
Figure 12B:
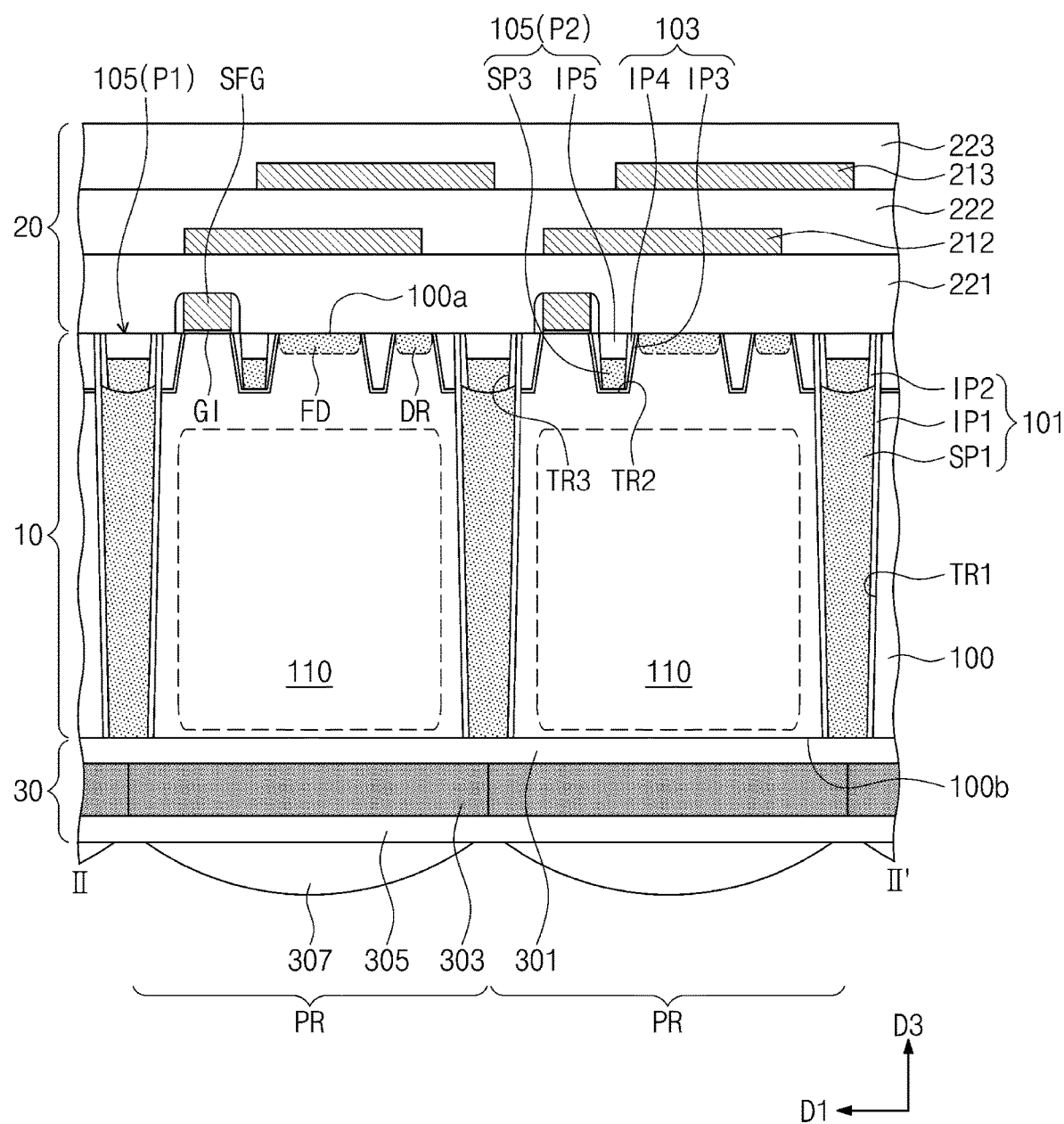

FIG. 11 illustrates a plan view of an image sensor according to embodiments of the inventive concepts. FIGS. 12A and 12B illustrate cross-sectional views respectively taken along lines I-I' and II-II' of FIG. 11. Regarding the embodiments of FIGS. 11, 12A and 12B, detailed description of technical features repetitive to technical features described above with reference to FIGS. 3, 4A, and 4B will be omitted, and differences between the embodiments of FIGS. 11, 12A and 12B and FIGS. 3, 4A and 4B will be described in detail.

Referring to FIGS. 11, 12A, and 12B, a third device isolation structure 105 is additionally provided on the first and second device isolation structures 101 and 103. The third device isolation structure 105 may have a top surface coplanar with the first surface 100a of the semiconductor substrate 100.

Upper portions of the first and second device isolation structures 101 and 103 are recessed to define a third trench TR3. The third trench TR3 is spaced apart from the first, second, and third active patterns ACT1, ACT2, and ACT3. The third trench TR3 may have a depth less than that of the first trench TR1. The depth of the third trench TR3 may be less than a depth of the second trench TR2. The third device isolation structure 105 may fill the third trench TR3. The third trench TR3 may be at a portion of the second trench TR2. Accordingly, the third device isolation structure 105 may fill a portion of the second trench TR2.

The third device isolation structure 105 includes a third conductive pattern SP3 and a fifth dielectric pattern IP5 on the third conductive pattern SP3. The fifth dielectric pattern IP5 may be adjacent to the first surface 100a, and have a top surface coplanar with the first surface 100a. For example, the fifth dielectric pattern IP5, the second dielectric pattern IP2, and the fourth dielectric pattern IP4 may have top surfaces coplanar with each other.

The third conductive pattern SP3 may include, for example, n-type doped polysilicon or p-type doped polysilicon. The fifth dielectric pattern IP5 may include for example a silicon oxide layer, a silicon oxynitride layer, or a silicon nitride layer. In contrast to and different from the second device isolation structure 103 described with reference to of FIGS. 3, 4A, and 4B, the second device isolation structure 103 according to the present embodiment of FIGS. 11, 12A and 12B does not include the second conductive pattern SP2. For example, according to the present embodiment, the second device isolation structure 103 includes the third dielectric pattern IP3 and the fourth dielectric pattern IP4.

The third device isolation structure 105 has a first segment P1 on the first device isolation structure 101 and a second segment P2 on the second device isolation structure 103. The first segment P1 may be provided on a boundary between neighboring pixel regions PR. The first segment P1 may be provided on the first device isolation structure 101 defining the boundary between the pixel regions PR. The first segment P1 may vertically overlap the first device isolation structure 101. When viewed in plan, the first segment P1 may have a linear shape extending in the first direction D1.

The second segment P2 is provided in the pixel region PR. The second segment P2 may be provided on the second device isolation structure 103 in the pixel region PR. The second segment P2 may vertically overlap at least a portion of the second device isolation structure 103. When viewed in plan, the second segment P2 may horizontally extend from the first segment P1 onto the pixel region PR. The second segment P2 may be positioned between the first, second, and third active patterns ACT1, ACT2, and ACT3.

The first segment P1 may have a bottom surface in contact with the top surface of the first conductive pattern SP1 of the first device isolation structure 101. The third conductive pattern SP3 of the first segment P1 may be in contact with the first conductive pattern SP1 of the first device isolation structure 101. The second segment P2 may have a bottom surface in contact with the third dielectric pattern IP3 on the bottom surface of the second trench TR2. The third conductive pattern SP3 of the second segment P2 may be in contact with the third dielectric pattern IP3 of the second device isolation structure 103.

The third conductive pattern SP3 of the first segment P1 may be electrically connected to the first conductive pattern SP1 of the first device isolation structure 101. Because the third conductive pattern SP3 of the second segment P2 horizontally extends from the third conductive pattern SP3 of the first segment P1, the third conductive pattern SP3 of the second segment P2 may also be electrically connected to the first conductive pattern SP1. The third dielectric pattern IP3 of the second device isolation structure 103 may insulate the third conductive pattern SP3 of the second segment P2 from the semiconductor substrate 100.

The first conductive pattern SP1 of the first device isolation structure 101 may be supplied with a negative voltage through the conductive line CL. Because the third conductive pattern SP3 is electrically connected to the first conductive pattern SP1, the third conductive pattern SP3 may also be supplied with the negative voltage. The second device isolation structure 103 may be provided thereon with the third conductive pattern SP3 on the pixel region PR. Accordingly, with the third conductive pattern SP3 supplied with the negative voltage, positive charges generated around the second device isolation structure 103 may be eliminated by the third conductive pattern SP3.

Figure 13:
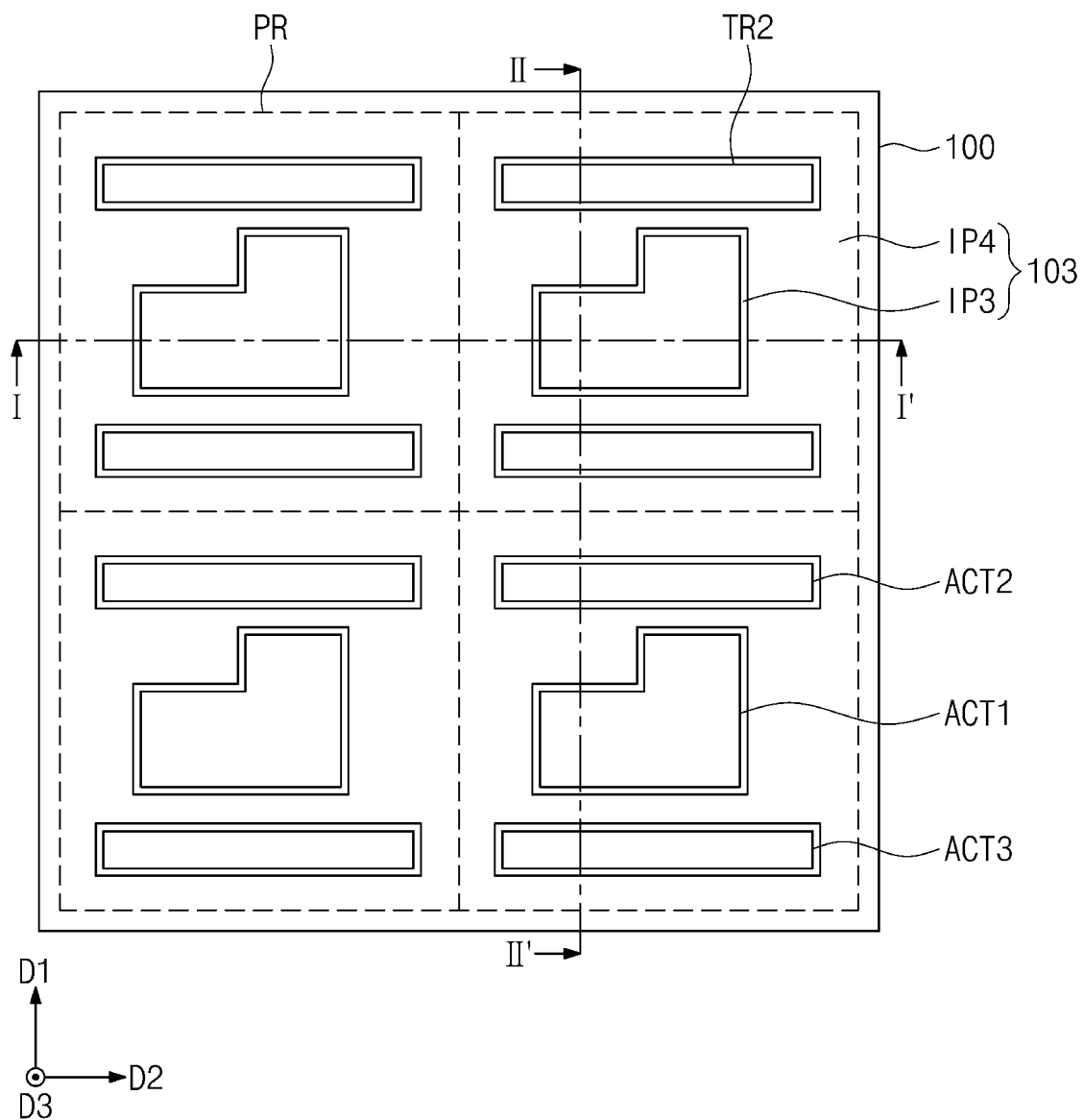
FIG. 13 illustrates a plan view of a method of fabricating an image sensor according to embodiments of the inventive concepts.
Figure 14A:
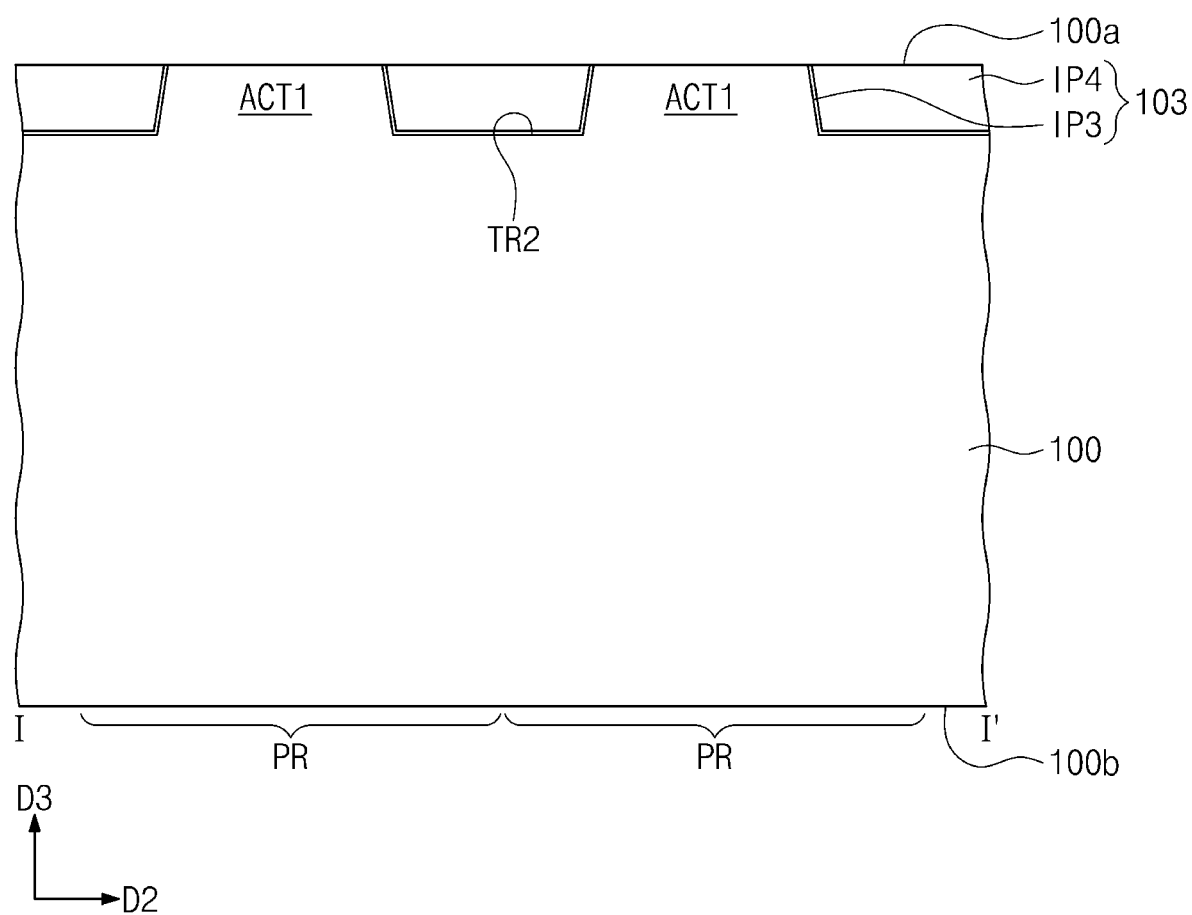
FIGS. 14A and 14B illustrate cross-sectional views respectively taken along line I-I' and along line II-II' of FIG. 13.
Figure 14B:
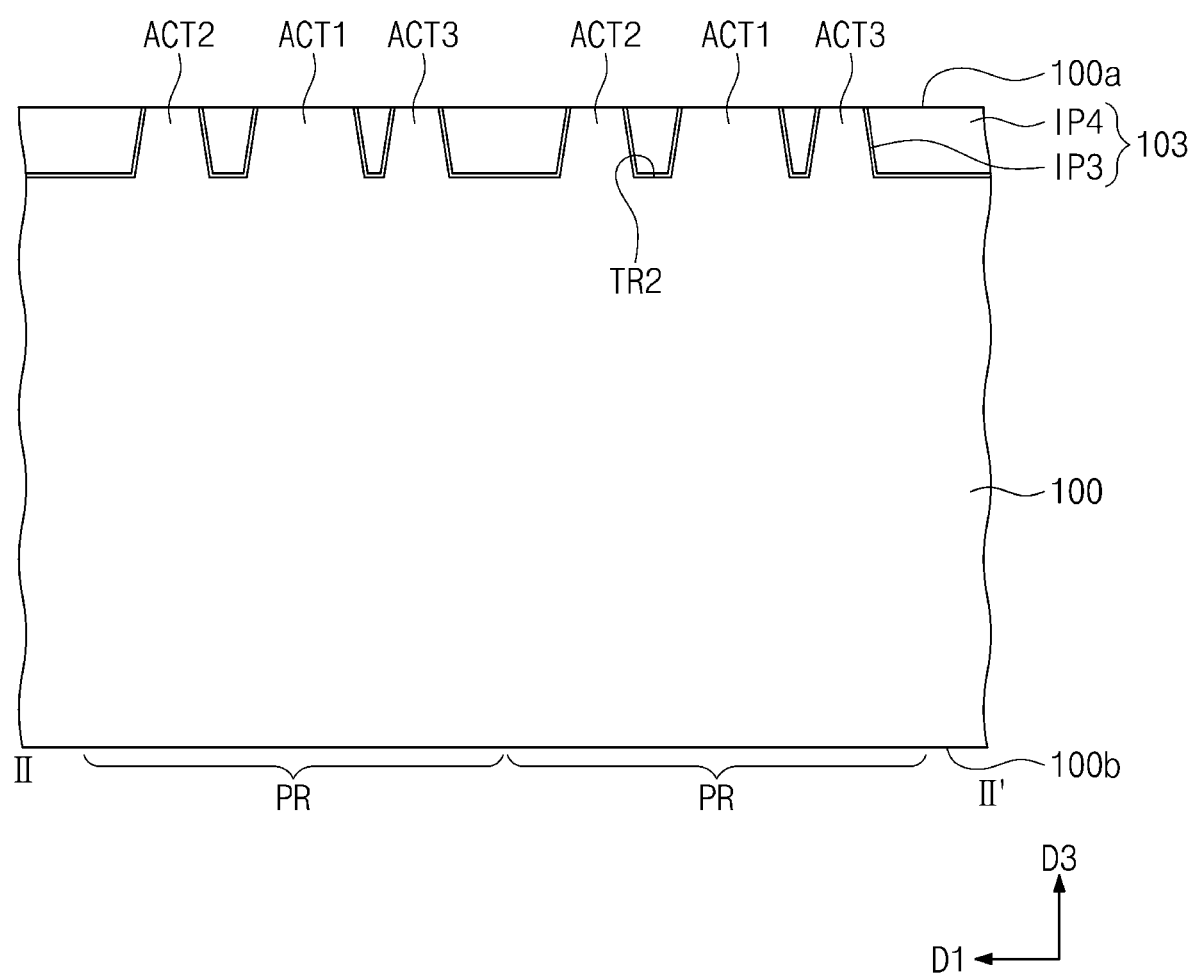
Figure 15:
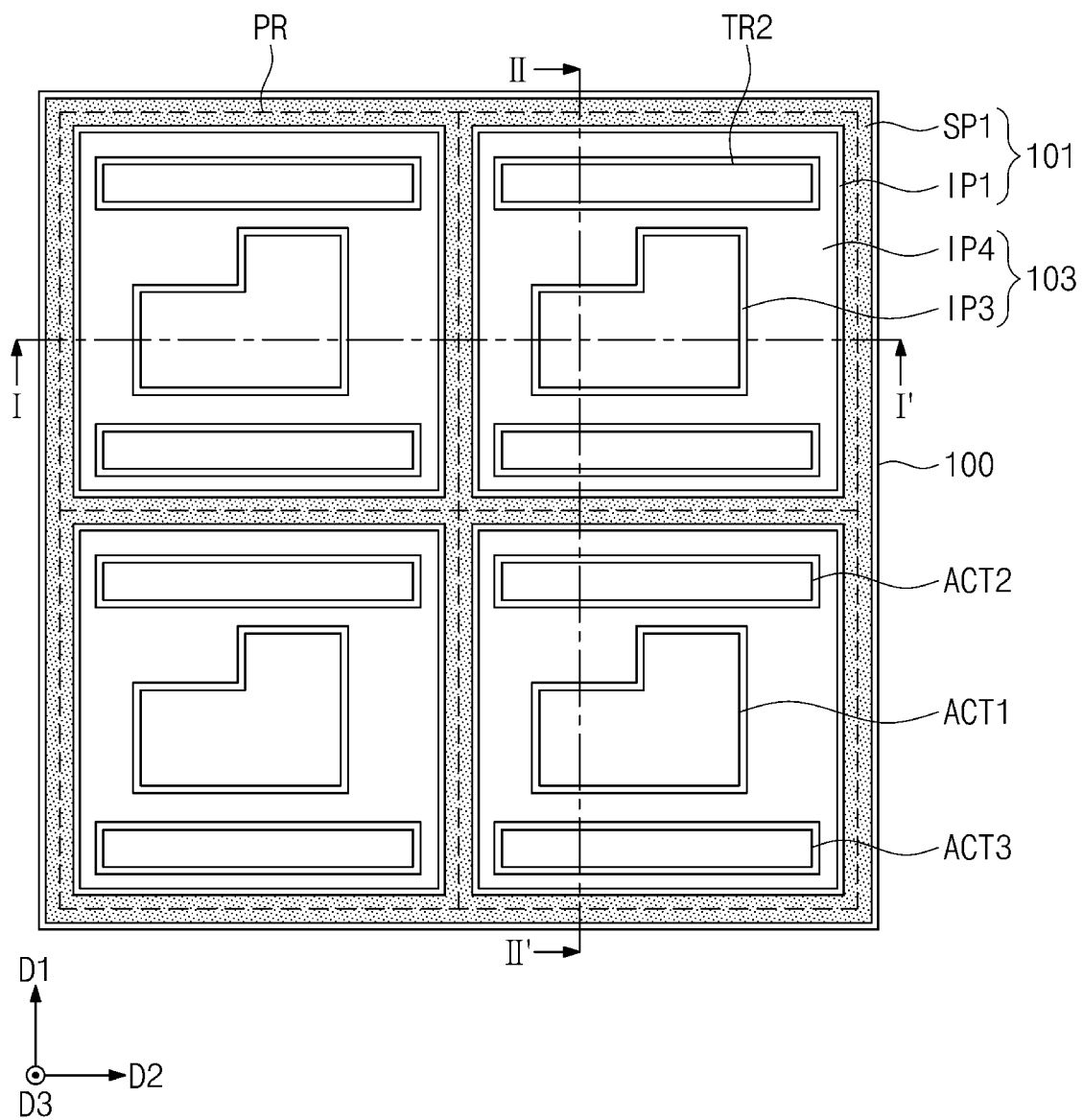
FIG. 15 illustrates a plan view of the method of fabricating an image sensor according to embodiments of the inventive concepts.
Figure 16A:
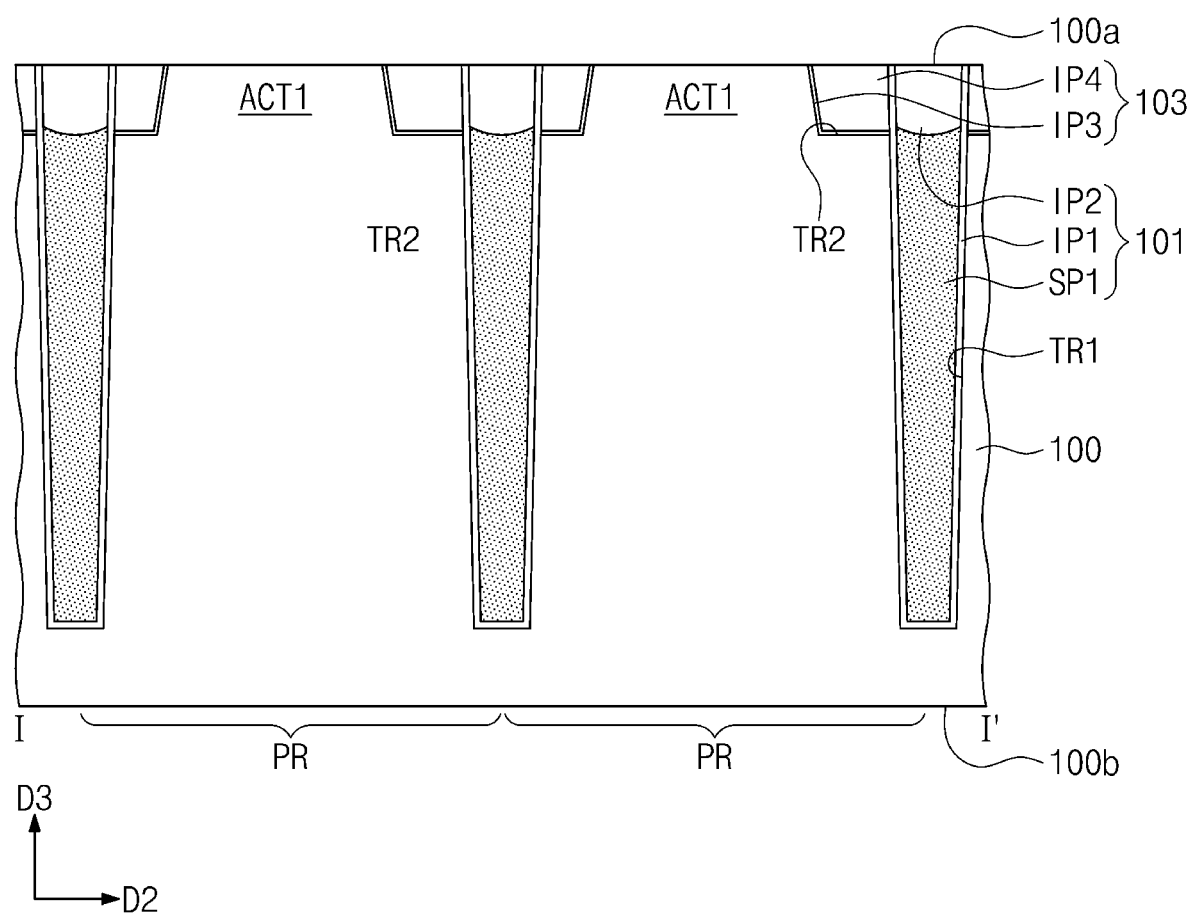
FIGS. 16A and 16B illustrate cross-sectional views respectively taken along line I-I' and along line II-II' of FIG. 15.
Figure 16B:
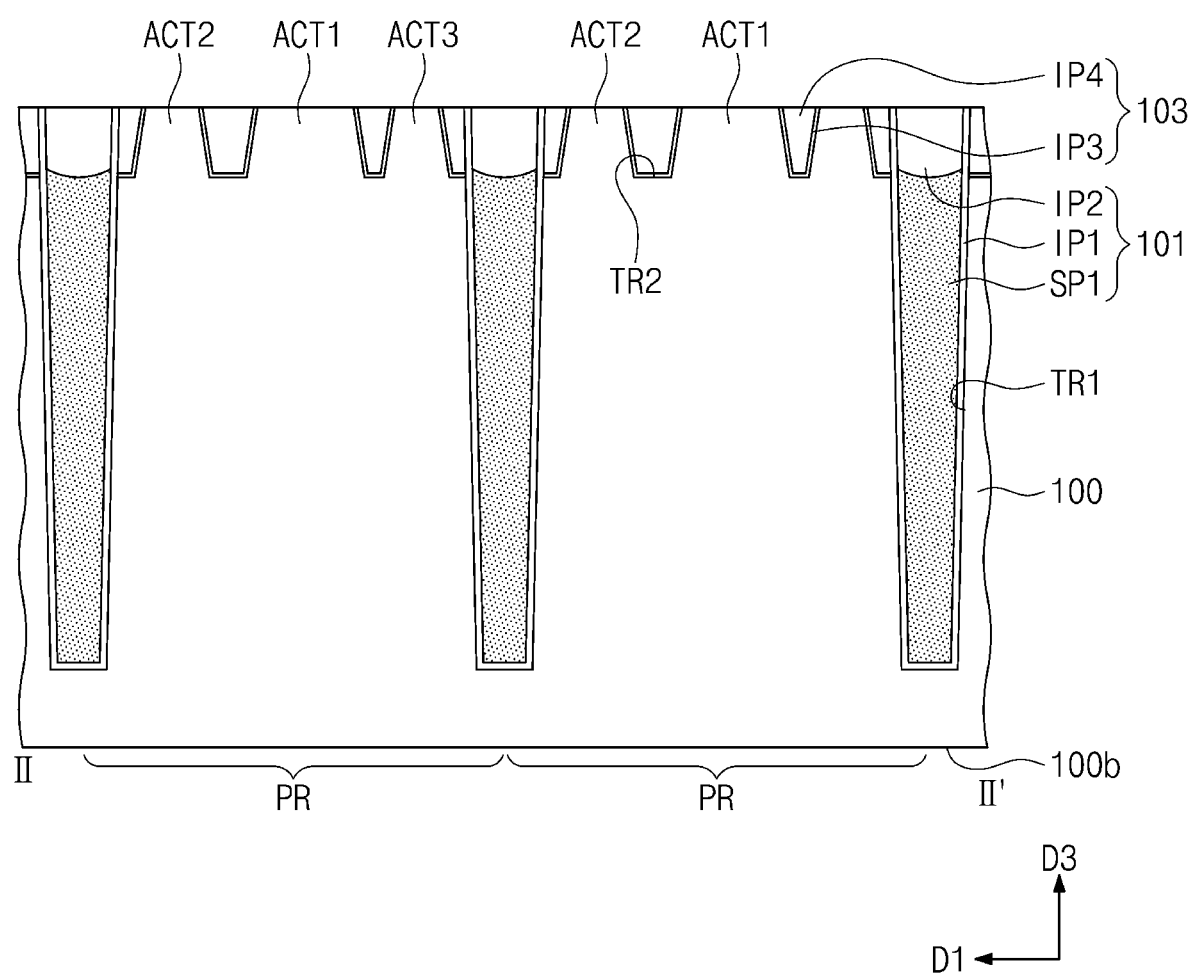
Figure 17:
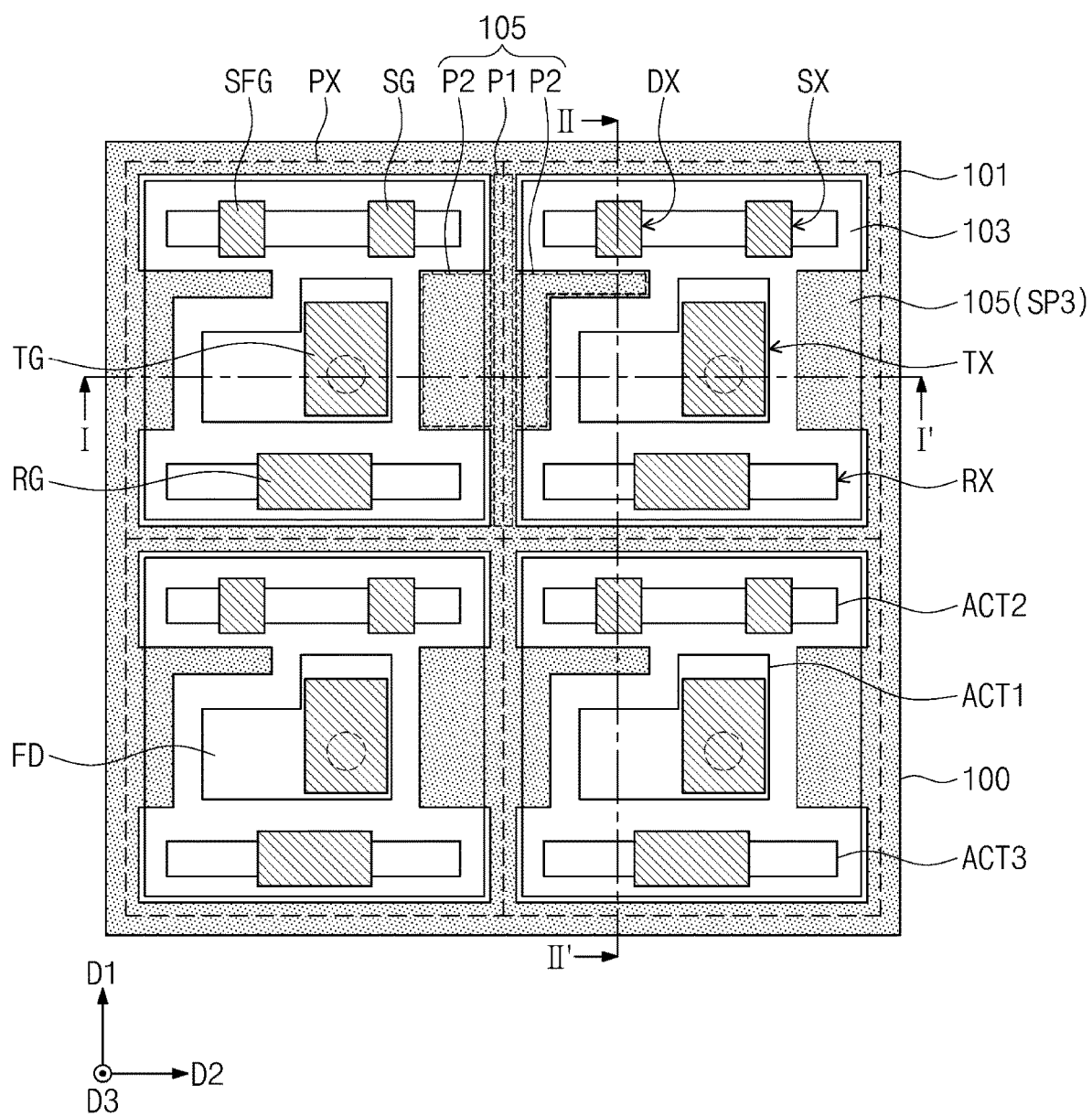
FIG. 17 illustrates a plan view of a method of fabricating the image sensor according to embodiments of the inventive concepts.
Figure 18A:
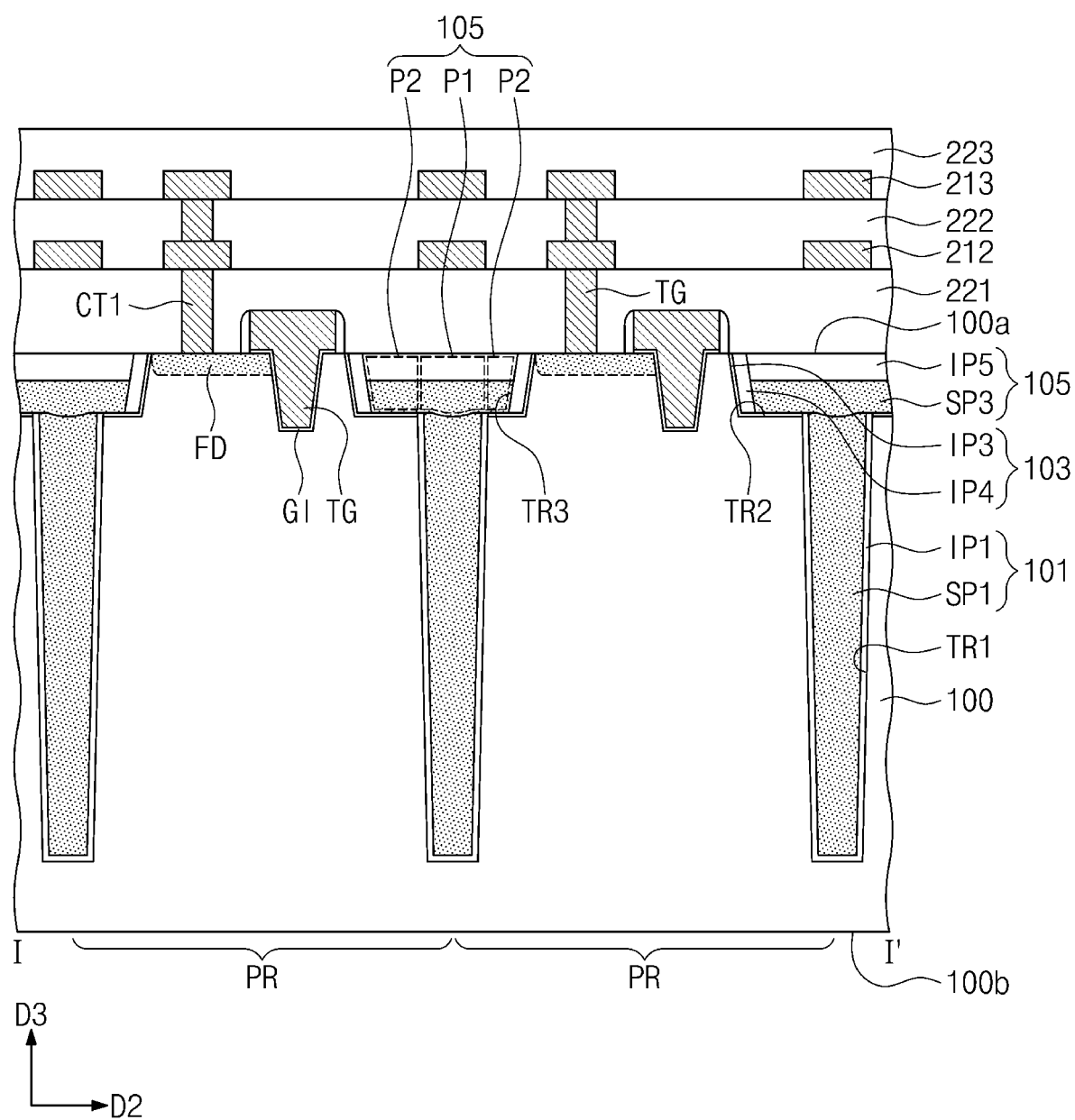
FIGS. 18A and 18B illustrate cross-sectional views respectively taken along line I-I' and along line II-II' of FIG. 17.
Figure 18B:
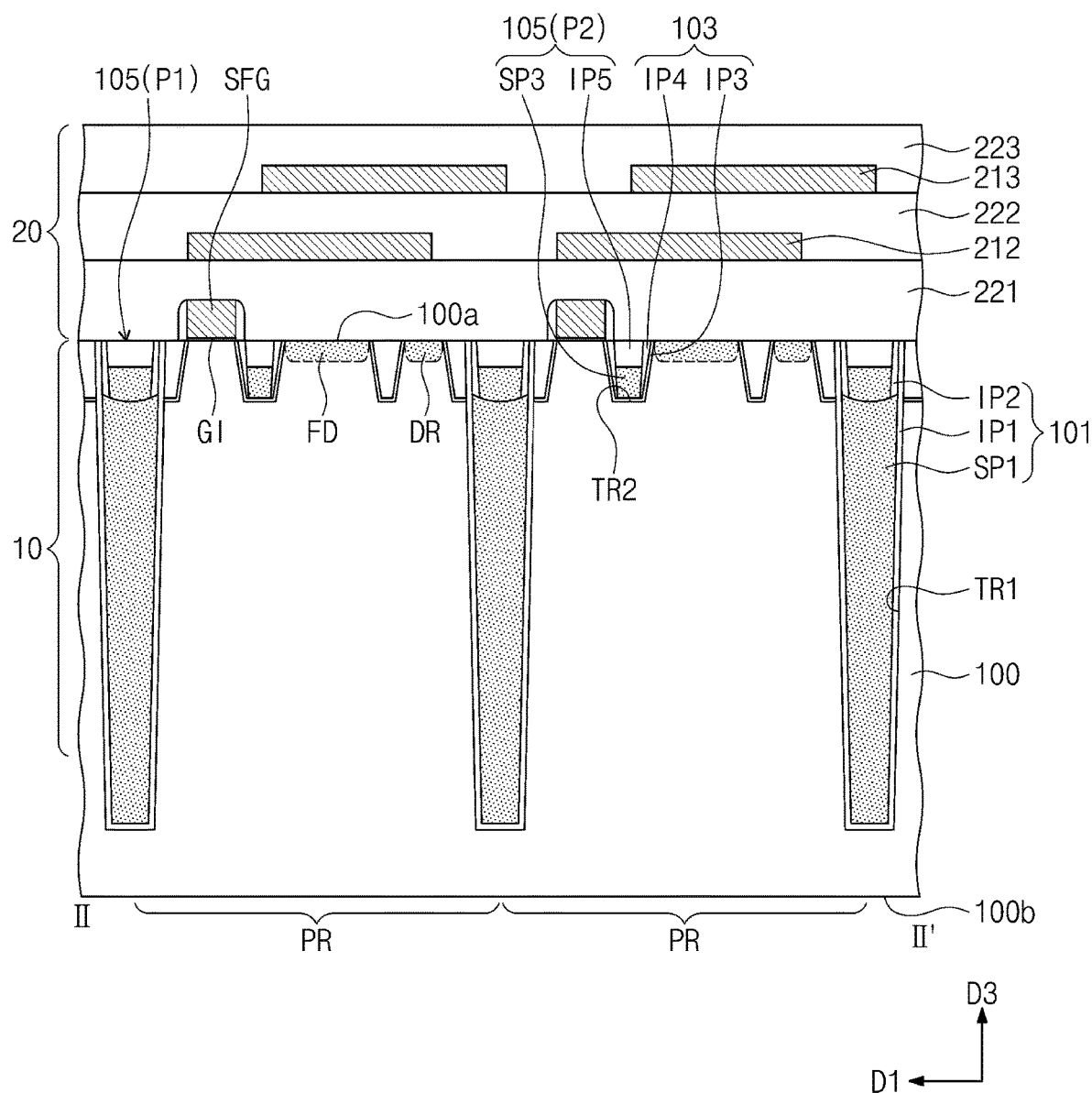

FIGS. 13, 15, and 17 illustrate plan views showing a method of fabricating an image sensor according to embodiments of the inventive concepts. FIGS. 14A, 16A, and 18A illustrate cross-sectional views taken along line I-I' of FIGS. 13, 15, and 17, respectively. FIGS. 14B, 16B, and 18B illustrate cross-sectional views taken along line II-II' of FIGS. 13, 15, and 17, respectively. Regarding the embodiments of FIGS. 13 to 18B, detailed description of technical features repetitive to technical features described with reference to FIGS. 5 to 10B will be omitted, and differences between the embodiments of FIGS. 13 to 18B and FIGS. 5 to 10B will be described in detail.

Referring to FIGS. 13, 14A, and 14B, a second device isolation structure 103 is formed on the first surface 100a of the semiconductor substrate 100. For example, a third dielectric pattern IP3 may be formed to partially fill a second trench TR2. A fourth dielectric pattern IP4 may be formed on the third dielectric pattern IP3. In contrast to and different from the second device isolation structure 103 described with reference to of FIGS. 5, 6A, and 6B, the second device isolation structure 103 according to the present embodiment does not include second conductive pattern SP2.

Referring to FIGS. 15, 16A, and 16B, a first device isolation structure 101 is formed on the first surface 100a of the semiconductor substrate 100. The formation of the first device isolation structure 101 may include forming a first dielectric pattern IP1, a first conductive pattern SP1, and a second dielectric pattern IP2 in a first trench TR1. The formation of the first device isolation structure 101 according to the present embodiment may be substantially the same as that of the first device isolation structure 101 described with reference to FIGS. 7, 8A, and 8B.

Referring to FIGS. 17, 18A, and 18B, a third device isolation structure 105 is formed on the first surface 100a of the semiconductor substrate 100. For example, upper portions of the first and second device isolation structures 101 and 103 may be patterned to form a third trench TR3. The third trench TR3 may penetrate the second dielectric pattern IP2 of the first device isolation structure 101 and expose a top surface of the first conductive pattern SP1. The third trench TR3 may expose the third dielectric pattern IP3 of the second device isolation structure 103. In the present embodiment, the third dielectric pattern IP3 may include a silicon nitride layer, and thus may serve as an etch stopper when an etching process is performed to form the third trench TR3.

A third conductive pattern SP3 is formed to partially fill the third trench TR3. The formation of the third conductive pattern SP3 may include forming a third conductive layer filling the third trench TR3 and performing an etch-back process on the third conductive layer. The third conductive pattern SP3 may fill a lower portion of the third trench TR3. The third conductive pattern SP3 may be formed to contact the top surface of the first conductive pattern SP1. The third conductive layer may include, for example, n-type doped polysilicon or p-type doped polysilicon.

A fifth dielectric pattern IP5 is formed on the third conductive pattern SP3. The formation of the fifth dielectric pattern IP3 may include forming a fifth dielectric layer filling an upper portion of the third trench TR3. The fifth dielectric layer may include, for example, a silicon oxide layer, a silicon oxynitride layer, or a silicon nitride layer. A planarization process may be performed on the fifth dielectric layer until the top surfaces of the first, second, and third active patterns ACT1, ACT2, and ACT3 are exposed, which results in the formation of the fifth dielectric pattern IP5. The third device isolation structure 105 may be constituted by the third conductive pattern SP3 and the fifth dielectric pattern IP5 that are formed in the third trench TR3.

Subsequently, on each of the pixel regions PR, a transfer transistor TX is formed on the first active pattern ACT1, a drive transistor DX and a select transistor SX are formed on the second active pattern ACT2, and a reset transistor RX is formed on the third active pattern ACT3.

First, second, and third interlayer dielectric layers 221, 222, and 223 and first and second connection lines 212 and 213 may be formed on the first surface 100a of the semiconductor substrate 100. First contacts CT1 may be formed to electrically connect the first and second connection lines 212 and 213 to the transfer transistors TX and the logic transistors RX, SX, and DX. In contrast to and different from the embodiments described with reference to FIGS. 9, 10A, and 10B, a second contact CT2 is not formed.

Referring back to FIGS. 11, 12A, and 12B, the second surface 100b of the semiconductor substrate 100 may undergo a planarization process to expose the first conductive pattern SP1 of the first device isolation structure 101. The pixel regions PR may be implanted with impurities to form photoelectric conversion regions 110 on corresponding pixel regions PR. Color filters 303 may be formed on corresponding pixel regions PR. Micro-lenses 307 may be formed on corresponding color filters 303.

According to the inventive concepts, an image sensor may be configured to apply a negative voltage to a first conductive pattern in a first trench, and to a second conductive pattern in a second trench shallower than the first trench. As a result, positive charges generated from a pixel region may be eliminated and dark current characteristics improved.

Although the inventive concepts have been described in connection with some example embodiments illustrated in the accompanying drawings, it should be understood to those skilled in the art that various changes and modifications may be made without departing from the technical spirit and essential feature of the present inventive concepts. It should be apparent to those skilled in the art that various substitutions, modifications, and changes may be made to the described example embodiments without departing from the scope and spirit of the present inventive concepts.

What is claimed is:

1. An image sensor, comprising:
   a semiconductor substrate having a first surface and a second surface, the semiconductor substrate including a pixel region having a photoelectric conversion region;
   a first conductive pattern in a first trench, the first trench defining the pixel region and extending from the first surface toward the second surface;
   a second conductive pattern in a second trench, the second trench being shallower than the first trench and defined between a plurality of active patterns on the first surface in the pixel region;
   a transfer transistor and a plurality of logic transistors on the active patterns; and
   a conductive line on the second surface and electrically connected to the first conductive pattern.

2. The image sensor of claim 1, wherein the first conductive pattern has a grid structure surrounding the pixel region.

3. The image sensor of claim 1, further comprising a dielectric pattern on the first conductive pattern,
   wherein the dielectric pattern fills an upper portion of the first trench, and
   wherein a top surface of the dielectric pattern is coplanar with the first surface.

4. The image sensor of claim 3, wherein
   the second trench penetrates the dielectric pattern and exposes a top surface of the first conductive pattern, and
   the second conductive pattern is in contact with the top surface of the first conductive pattern.

5. The image sensor of claim 1, further comprising a device isolation structure defining the active patterns,
   wherein the second trench is in the device isolation structure, and
   wherein the device isolation structure insulates the second conductive pattern from the semiconductor substrate.

6. The image sensor of claim 1, wherein a bottom surface of the first conductive pattern is coplanar with the second surface.

7. The image sensor of claim 1, further comprising a first dielectric pattern in the second trench,
   wherein the first dielectric pattern is interposed between the semiconductor substrate and the second conductive pattern, and
   wherein the first dielectric pattern insulates the second conductive pattern from the semiconductor substrate.

8. The image sensor of claim 7, further comprising a second dielectric pattern on the second conductive pattern,
   wherein the second dielectric pattern fills an upper portion of the second trench, and
   wherein a top surface of the second dielectric pattern is coplanar with the first surface.

9. The image sensor of claim 1, further comprising:
   a connection line layer on the first surface; and
   a contact electrically connecting the second conductive pattern to a connection line of the connection line layer.

10. The image sensor of claim 1, further comprising:

a color filter on the second surface in the pixel region; and
a micro-lens on the color filter.

11. An image sensor, comprising:
a semiconductor substrate having a first surface and a second surface, the semiconductor substrate including a pixel region having a photoelectric conversion region;
a first device isolation structure having a grid structure surrounding the pixel region, the first device isolation structure including a first conductive pattern;
a second device isolation structure in the pixel region, the second device isolation structure including a second conductive pattern; and
a conductive line on the second surface and electrically connected to the first conductive pattern,
wherein top surfaces of the first and second device isolation structures are coplanar with the first surface, and
wherein a distance between a bottom surface of the first device isolation structure and the second surface is less than a distance between a bottom surface of the second device isolation structure and the second surface.

12. The image sensor of claim 11, wherein
the first device isolation structure further includes a first dielectric pattern on the first conductive pattern,
the second device isolation structure further includes a second dielectric pattern on the second conductive pattern,
wherein top surfaces of the first and second dielectric patterns are coplanar with the first surface.

13. The image sensor of claim 11, wherein the second device isolation structure comprises:
a first segment on the first device isolation structure; and
a second segment extending from the first segment into the pixel region,
wherein the second conductive pattern of the first segment is in contact with a top surface of the first conductive pattern.

14. The image sensor of claim 13, further comprising a third device isolation structure defining a plurality of active patterns on the first surface of the pixel region,
wherein the second segment of the second device isolation structure is on the third device isolation structure, and
wherein the third device isolation structure insulates the second conductive pattern of the second segment from the semiconductor substrate.

15. The image sensor of claim 11, further comprising:
a connection line layer on the first surface; and
a contact electrically connecting the second conductive pattern to a connection line of the connection line layer.

16. An image sensor, comprising:
a semiconductor substrate having a first surface and a second surface, the semiconductor substrate including a pixel region having a photoelectric conversion region;
a first device isolation structure having a grid structure surrounding the pixel region; and
a second device isolation structure in the pixel region,
wherein the first device isolation structure includes a first conductive pattern and a first dielectric pattern on the first conductive pattern,
wherein the second device isolation structure includes a second conductive pattern and a second dielectric pattern on the second conductive pattern,
wherein top surfaces of the first dielectric pattern and the second dielectric pattern are coplanar with the first surface, and
wherein a distance between a top surface of the second conductive pattern and the first surface is less than a distance between a top surface of the first conductive pattern and the first surface.

17. The image sensor of claim 16, further comprising a conductive line on the second surface and electrically connected to the first conductive pattern.

18. The image sensor of claim 16, wherein the second device isolation structure comprises:
a first segment on the first device isolation structure; and
a second segment extending from the first segment into the pixel region,
wherein the second conductive pattern of the first segment is in contact with the top surface of the first conductive pattern.

19. The image sensor of claim 18, further comprising a third device isolation structure defining a plurality of active patterns on the first surface of the pixel region,
wherein the second segment of the second device isolation structure is on the third device isolation structure, and
wherein the third device isolation structure insulates the second conductive pattern of the second segment from the semiconductor substrate.

20. The image sensor of claim 16, further comprising:
a connection line layer on the first surface; and
a contact electrically connecting the second conductive pattern to a connection line of the connection line layer.

* * * * *